United States Patent
Olsen et al.

(10) Patent No.: US 7,795,577 B2
(45) Date of Patent: Sep. 14, 2010

(54) LENS FRAME AND OPTICAL FOCUS ASSEMBLY FOR IMAGER MODULE

(76) Inventors: Richard Ian Olsen, 101 Academy Dr., Suite 100, Irvine, CA (US) 92617; Darryl L. Sato, 101 Academy Dr., Suite 100, Irvine, CA (US) 92617; Jeffrey A. Brady, 101 Academy Dr., Suite 100, Irvine, CA (US) 92617; James Gates, 101 Academy Dr., Suite 100, Irvine, CA (US) 92617; Han Tai, 101 Academy Dr., Suite 100, Irvine, CA (US) 92617

( * ) Notice: Subject to any disclaimer, the term of this patent is extended or adjusted under 35 U.S.C. 154(b) by 0 days.

(21) Appl. No.: 11/825,382

(22) Filed: Jul. 5, 2007

(65) Prior Publication Data

US 2007/0295893 A1 Dec. 27, 2007
US 2009/0302205 A9 Dec. 10, 2009

Related U.S. Application Data

(63) Continuation-in-part of application No. 11/212,803, filed on Aug. 25, 2005, now abandoned.

(60) Provisional application No. 60/604,854, filed on Aug. 25, 2004, provisional application No. 60/695,946, filed on Jul. 1, 2005.

(51) Int. Cl.
*H01J 40/14* (2006.01)
*H01J 5/02* (2006.01)

(52) U.S. Cl. .................. 250/239; 250/226; 250/234; 348/335; 348/336; 348/345; 348/374

(58) Field of Classification Search ............ 250/239, 250/226, 234; 359/622; 348/335, 336, 345, 348/374
See application file for complete search history.

(56) References Cited

U.S. PATENT DOCUMENTS 3,609,367 A 9/1971 Barron (Continued)

FOREIGN PATENT DOCUMENTS

EP 599470 6/1994

(Continued)

OTHER PUBLICATIONS

Duparre et al., "Theoretical analysis of an artificial superposition compound eye for application in ultra flat digital image acquisition devices," Proceedings of SPIE, vol. 5249, 2004, pp. 408-418.

(Continued)

*Primary Examiner*—Seung C Sohn

(57) ABSTRACT

An imager apparatus and methods are described. An embodiment of an imager module includes a plurality of groups of optical lenses, a lens frame, and at least one associated lens barrel configured to position and hold the plurality of groups of optical lenses. At least one of the groups of optical lenses is movable with respect to at least one other group of optical lenses for achieving optical focus. The imager module includes an integrated circuit (IC) imager die in proximity to the plurality of lenses, the imager die containing at least one image capture microelectronic device. The imager module includes a modular frame assembly that contains a first portion that holds a plurality of lens barrels, each containing one or more focusing lenses, and a second portion that supports the first portion at a specific distance from the substrate being imaged. The lens barrels are each responsive to different wavelengths or bands of wavelengths. The first and second portions include minimal, partial, or full partition structures between the imaging areas defined by the lens barrels.

42 Claims, 36 Drawing Sheets

U.S. PATENT DOCUMENTS

| | | | |
|---|---|---|---|
| 3,971,065 | A | 7/1976 | Bayer |
| 4,323,925 | A | 4/1982 | Abell et al. |
| 4,385,373 | A | 5/1983 | Howe |
| 4,894,672 | A | 1/1990 | Tanaka |
| 5,005,083 | A | 4/1991 | Grage et al. |
| 5,051,830 | A | 9/1991 | Von Hoessle |
| 5,436,660 | A | 7/1995 | Sakamoto |
| 5,654,752 | A | 8/1997 | Yamazaki |
| 5,691,765 | A | 11/1997 | Schieltz et al. |
| 5,694,165 | A | 12/1997 | Yamazaki et al. |
| 5,742,659 | A | 4/1998 | Atac et al. |
| 5,760,832 | A | 6/1998 | Yamanaka et al. |
| 5,766,980 | A | 6/1998 | Ohtagaki et al. |
| 5,850,479 | A | 12/1998 | Terry et al. |
| 6,137,535 | A | 10/2000 | Meyers |
| 6,375,075 | B1 | 4/2002 | Ackley et al. |
| 6,727,521 | B2 | 5/2002 | Merrill et al. |
| 6,429,898 | B1 | 8/2002 | Shoda et al. |
| 6,437,335 | B1 | 8/2002 | Bohn |
| 6,570,613 | B1 | 5/2003 | Howell |
| 6,611,289 | B1 | 8/2003 | Yu et al. |
| 6,617,565 | B2 | 9/2003 | Wu |
| 6,714,239 | B2 | 3/2004 | Guidash |
| 6,381,072 | B1 | 4/2004 | Burger |
| 6,765,617 | B1 | 7/2004 | Tangen et al. |
| 6,833,873 | B1 | 12/2004 | Suda |
| 6,834,161 | B1 | 12/2004 | Stiehler |
| 6,841,816 | B2 | 1/2005 | Merrill et al. |
| 6,859,299 | B1 | 2/2005 | Chiao |
| 6,882,368 | B1 | 4/2005 | Suda |
| 6,882,864 | B2 | 4/2005 | Miyake |
| 6,885,404 | B1 | 4/2005 | Suda |
| 6,885,508 | B2 | 4/2005 | Yamaguchi et al. |
| 6,903,770 | B1 | 6/2005 | Kobayashi et al. |
| 6,946,647 | B1 | 9/2005 | O'Neill et al. |
| 6,952,228 | B2 | 10/2005 | Yoneda et al. |
| 6,960,817 | B2 | 11/2005 | Ogura et al. |
| 7,095,159 | B2 | 8/2006 | Machida |
| 7,095,561 | B2 | 8/2006 | Mitchell et al. |
| 7,115,853 | B2 | 10/2006 | Jiang et al. |
| 7,123,298 | B2 | 10/2006 | Schroeder et al. |
| 7,164,113 | B2 | 1/2007 | Inokuma et al. |
| 7,170,665 | B2 | 1/2007 | Kaneko et al. |
| 7,199,348 | B2 | 4/2007 | Olsen et al. |
| 7,206,136 | B2 | 4/2007 | Labaziewicz et al. |
| 7,214,926 | B2 | 5/2007 | Gruhlke et al. |
| 7,223,954 | B2 | 5/2007 | McNulty |
| 7,236,306 | B2 | 6/2007 | Janson, Jr. et al. |
| 7,239,345 | B1 | 7/2007 | Rogina |
| 7,256,944 | B2 | 8/2007 | Labaziewicz et al. |
| 7,280,290 | B2 | 10/2007 | Araki et al. |
| 7,305,180 | B2 | 12/2007 | Labaziewicz et al. |
| 7,358,483 | B2 * | 4/2008 | Mitsugi et al. .............. 250/239 |
| 7,362,357 | B2 | 4/2008 | Brown et al. |
| 7,379,104 | B2 | 5/2008 | Hattori et al. |
| 7,417,674 | B2 | 8/2008 | Gruhlke |
| 7,453,510 | B2 | 11/2008 | Kolehmainen et al. |
| 7,460,160 | B2 | 12/2008 | Hershey et al. |
| 2002/0024606 | A1 | 2/2002 | Yuki et al. |
| 2002/0051071 | A1 | 5/2002 | Itano et al. |
| 2002/0089596 | A1 | 7/2002 | Suda |
| 2002/0113888 | A1 | 8/2002 | Sonoda et al. |
| 2002/0122124 | A1 | 9/2002 | Suda |
| 2003/0020814 | A1 | 1/2003 | Ono |
| 2003/0086013 | A1 | 5/2003 | Aratani |
| 2003/0160886 | A1 | 8/2003 | Misawa et al. |
| 2003/0209651 | A1 | 11/2003 | Iwasaki |
| 2003/0234907 | A1 | 12/2003 | Kawai |
| 2004/0012688 | A1 | 1/2004 | Tinnerino et al. |
| 2004/0012689 | A1 | 1/2004 | Tinnerino et al. |
| 2004/0027687 | A1 | 2/2004 | Bittner et al. |
| 2004/0080638 | A1 | 4/2004 | Lee |
| 2004/0183918 | A1 | 9/2004 | Squilla et al. |
| 2005/0128509 | A1 | 6/2005 | Tokkonen et al. |
| 2005/0134712 | A1 | 6/2005 | Gruhlke et al. |
| 2005/0160112 | A1 | 7/2005 | Makela et al. |
| 2006/0087572 | A1 | 4/2006 | Schroeder |
| 2006/0108505 | A1 | 5/2006 | Gruhlke et al. |
| 2006/0125936 | A1 | 6/2006 | Gruhlke et al. |
| 2006/0187322 | A1 | 8/2006 | Janson, Jr. et al. |
| 2006/0187338 | A1 | 8/2006 | May et al. |
| 2007/0002159 | A1 | 1/2007 | Olsen et al. |

FOREIGN PATENT DOCUMENTS

| | | |
|---|---|---|
| EP | 1 032 045 | 8/2000 |
| JP | 62-011264 | 1/1987 |

OTHER PUBLICATIONS

Duparre et al., "Ultra-Thin Camera Based on Artificial Apposition Compound Eyes," Proc. 10th Microoptics Conference MOC '04, Jena, 2004, Paper E-2 (2 pages).

Duparré et al., "Artificial apposition compound eye fabricated by micro-optics technology," Applied Optics, vol. 43, No. 22, Aug. 2004, pp. 4303-4310.

Duparre et al., "Artificial compound eyes—different concepts and their application to ultra flat image acquisition sensors," Proceeding so SPIE, vol. 5346 (SPIE, Bellingham, WA, 2004), pp. 89-100.

Duparre et al., "Microoptical telescope compound eye," Optics Express, vol. 13, No. 3, Feb. 2005, pp. 889-903.

Kitamura et al., "Reconstruction of a high-resolution image on a compound-eye image-capturing system," Applied Optics, vol. 43, No. 8, Mar. 2004, pp. 1719-1727.

Miki et al., "A Study of Multi-Stack Silicon-Directed Wafer Bonding for MEMS Manufacturing," 2002., IEEE, pp. 407-410.

Miyatake et al., "Thin observatiion module by bound optics (TOMBO) with color filters," SPEI and IS&T, vol. 5301, 2004, pp. 7-12.

Norvell, Robin, Shellcase Debuts Ultra-Thin Miniaturization for Optics, Jul. 8, 2005, (1 page).

Shogenji et al., "Bimodal fingerprint capturing system based on compound-eye imaging module," Applied Optics, vol. 43, No. 6, Feb. 2004, pp. 1355-1359.

Shogenji et al., "Multispectral imaging using compact compound optics," Optics Express, vol. 12, No. 8., Apr. 2004, pp. 1643-1655.

Stager et al., "Replicated Micro-Optics for Automotive Applications," SPIE European Workshop on Photonics in the Automobile, Geneva, 2004, (8 pages).

Tanida et al., "Compact image capturing system based on compound imaging and digital reconstruction," Proceedings of SPIE, vol. 4455, 2001, pp. 34-41.

Tanida, "Color imaging with an integrated compound imaging system," Optics Express, vol. 11, No. 18, Sep. 2003, pp. 2109-2117.

Völkel et al., "Miniaturization of Imaging Systems," mstnews, Feb. 2003, pp. 36-38.

Volkel et al., "Miniaturized imaging systems," Elsevier Science B.V., Microelectronic Engineering 67-68 (2003), pp. 461-472.

Wood et al., "Resolution Improvement for Compound Eye Images Through Lens Diversity," IEEE, Signal Processing Society, DSP/SPE Workshop, Aug. 2, 2004 (5 pages).

International Search Report and Written Opinion for PCT/US05/30256 mailed Jul. 7, 2008.

International Preliminary Report on Patentability for PCT/US2005/030256 issued Mar. 17, 2009.

International Search Report and Written Opinion for PCT/US06/25781 mailed Jul. 22, 2008.

International Preliminary Report on Patentability for PCT/US2006/025781 issued Mar. 10, 2009.

Office Action from U.S. Appl. No. 11/788,120, mailed May 19, 2009.

Notice of Allowance for U.S. Appl. No. 11/478,242, mailed Dec. 30, 2009.

Notice of Allowance for U.S. Appl. No. 11/888,546, mailed Dec. 14, 2009.

Office Action for U.S. Appl. No. 11/788,279, mailed Jan. 21, 2010.

First Office Action for Chinese Application 200580032374.0, notification date Feb. 5, 2010.
Office Action on U.S. Appl. No. 11/810,623 mailed Feb. 4, 2010.
Search Report for EP Application 05793927.4, dated Feb. 26, 2010.
Office Action for U.S. Appl. No. 11/888,582, mailed Sep. 3, 2009.
Office Action for U.S. Appl. No. 11/478,242, mailed Sep. 16, 2009.
Office Action for U.S. Appl. No. 11/788,120, mailed Sep. 18, 2009.
Office Action on U.S. Appl. No. 11/788,120, mailed Apr. 16, 2010.
Final Office Action for U.S. Appl. No. 11/788,120, mailed Jul. 30, 2010.

* cited by examiner

1001

1300

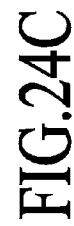
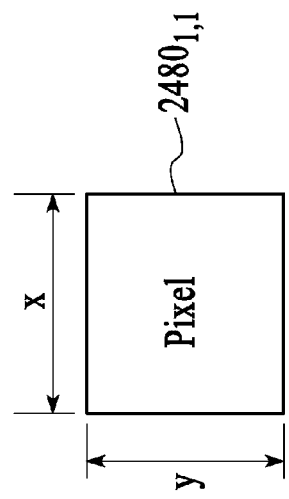
FIG.24C
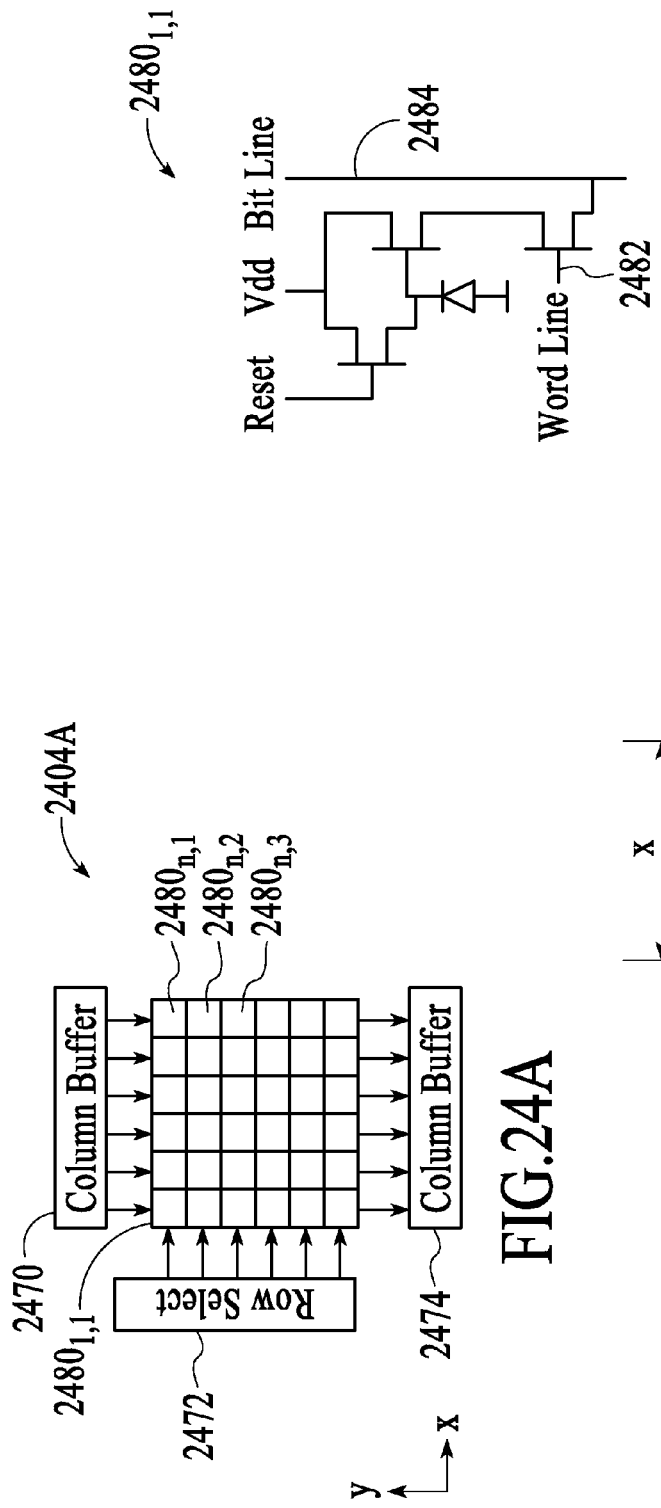
FIG.24A
FIG.24B

LENS FRAME AND OPTICAL FOCUS ASSEMBLY FOR IMAGER MODULE

CROSS-REFERENCE TO RELATED APPLICATIONS

This application is a continuation-in-part of U.S. patent application Ser. No. 11/212,803, entitled "Apparatus for Multiple Camera Devices and Method of Operating Same," filed on Aug. 25, 2005 now abandoned, which claims priority to U.S. Provisional Patent App. No. 60/604,854 filed Aug. 25, 2004 and U.S. Provisional Patent App. No. 60/695,946 filed Jul. 1, 2005; and is related to U.S. patent application Ser. No. 11/478,242, entitled "Method and Apparatus for Use in Camera and Systems Employing Same," filed on Jun. 29, 2006, which are each entirely incorporated by reference herein.

TECHNICAL FIELD

The following disclosure relates generally to optical devices and more particularly to a frame assembly for mounting lens elements for microelectronic imaging circuitry.

BACKGROUND

Unlike traditional film cameras that use film to capture and store an image, digital cameras use solid-state microelectronic image sensors to capture an image and use digital memory to store the image. The microelectronic image sensors are small silicon chips (also referred to as integrated circuits or ICs), or die. The microelectronic image sensors are variously referred to as imager chips or ICs, image capture chips or ICs, imager die or microelectronic imagers. An imager chip contains thousands to millions of photosensitive detectors called photosites. The combination of a photosite and its circuitry is referred to as a pixel. When the shutter (mechanical and/or electrical) is open or enabled, each photosite records the intensity or brightness of the incident light by accumulating a charge; the more light, the higher the charge. The brightness and/or color data for a corresponding pixel of the captured image is subsequently read out from the capture circuitry to digitization circuitry and then to digital storage circuitry. Digitization can be accomplished on the imager chip (for example within the pixel, at each array column, or after row/column multiplexing) or accomplished with analog-to-digital circuitry external to the imager circuitry. The digital values representing brightness and color can then be used to reconstruct the captured image on a variety of display mechanisms or ink printed paper.

Microelectronic imagers are used in digital cameras, cell phones, Personal Digital Assistants (PDAs), other wired and wireless devices with picture taking (image capture) capabilities, and many other imaging applications. The market for microelectronic imagers has been steadily increasing as they become smaller and produce better quality images with higher pixel counts. In order to reduce manufacturing cost and size of the entire image sensor, new approaches are required to reduce optics complexity, improve optical performance, simplify and automate optics alignment, and reduce overall component count and size in the final image sensor assembly.

Microelectronic sensors include integrated circuits such as Charged Coupled Device (CCD) image sensors or Complementary Metal-Oxide Semiconductor (CMOS) image sensors. CCD image sensors have been widely used in digital cameras because of their high performance. CMOS image sensors are displacing the CCD in many applications because performance is rapidly improving comparable to the CCD, and the high yields of the CMOS fabrication process enable low production costs for each imager chip. CMOS image sensors can provide these advantages because they are manufactured using technology and equipment developed for fabricating standard integrated circuit semiconductor devices. CMOS image sensors, as well as CCD image sensors, are packaged to protect the delicate components, interface with optical components and provide external electrical contacts.

FIG. 1 is a cross-sectional view of a conventional microelectronic imager module 1 with a conventional package and associated optics. The imager module 1 includes an integrated circuit die 10, an interposer substrate 20 attached to the die 10, and a housing 30 attached to the interposer substrate 20. The housing 30 surrounds the periphery of the imager die 10 and has an opening 32. The imager module 1 also includes an optically transparent cover 40 over the die 10.

The integrated circuit die 10 includes an image sensor region and associated circuitry 12 and a number of bond-pads 14 electrically coupled to the electrical circuitry 12. The interposer substrate 20 has a plurality of wire bond-pads 22, a plurality of bump/solder-pads 24, and traces 26 electrically coupling bond-pads 22 to corresponding bump/solder-pads 24. The bump/solder-pads 24 are arranged in an array for surface mounting the imager 1 to a board or module of another device. The wire bond-pads 14 on the die 10 are electrically coupled to the wire bond-pads 22 on the interposer substrate 20 by wire-bonds 28 to provide electrical pathways between the wire bond-pads 14 and the bump/solder-pads 24.

The imager module 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes an assembly of lenses 70 carried by the barrel 60. The optical focus is achieved by moving all the lenses in unison towards the imaging sensor until optimal performance is achieved.

One problem with packaging a conventional microelectronic imager conventionally as shown in FIG. 1 is that the resultant imaging module has a relatively large footprint. The footprint of the imager module 1 for example is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imager modules with smaller footprints.

Another problem with packaging a conventional microelectronic imager is the complexity of the optical assembly and focus mechanism. The optical assembly 70 typically has a diameter significantly larger than the image sensor region 12. The optical assembly is connected to a lens barrel 60 that adds additional diameter size to the imager footprint. The lens barrel 60 has threads 62 that mate with threads 52 on the support 50. These sets of threads align the optics to the image sensor and provided movement in the z-dimension to obtain accurate optical focus and sharpness of image. All the precision aligned optic lenses in the assembly 70 are displaced together in the z-direction to adjust the back focal length and focus the imager. The combination of optical assembly 70, barrel 60 and support 50 further increases the diameter size and module footprint. The use of threads and barrel rotation, R, with respect to the support 50 to focus the optics is difficult to implement in an automated assembly of the imager. The thread movement is also a source of particles than can eventually reside over the imaging area where they may degrade image quality. The requirement for threads also increases cost of the module. Alignment of the image capture components can be difficult, particularly in small cameras (e.g., cameras in mobile telephones) because multiple devices are mounted on the interposer substrate and the tolerances accumulate to reduce the precision with which the image capture device components can be aligned.

What is needed, therefore, is an imager module that reduces optical complexity while maintaining high imaging performance, alleviates mechanical alignment problems, allows automated assembly, requires fewer components, provides smaller overall imager module footprint and less electrical interfaces than prior art solutions. What is also needed is an imager module that requires fewer manufacturing steps, shorter assembly time and lower cost as compared to prior imager modules.

BRIEF DESCRIPTION OF THE DRAWINGS

FIGS. 24A-24C are schematic representations of a sensor array, under an embodiment.

INCORPORATION BY REFERENCE

All publications and patent applications mentioned in this specification are herein incorporated by reference to the same extent as if each individual publication or patent application was specifically and individually indicated to be incorporated by reference.

DETAILED DESCRIPTION

Embodiments of a lens assembly and frame for an imager module are described below. Embodiments include an optical configuration of an imager module, and a method for mounting and focusing to image sensor microelectronic circuitry. In an embodiment, at least group of optical lenses in an optical channel is movable with respect to another group of optical lenses in the same optical channel for achieving optical focus. Embodiments of the imager module include a modular frame assembly that contains an upper portion that holds a plurality of lens barrels, each containing one or more focusing lenses, and a lower portion that supports the upper portion at a specific distance from the substrate being imaged. The lenses of each separate lens barrels are responsive to different wavelengths or bands of wavelengths. The first and second portions include minimal, partial, or full partition structures between the imaging areas defined by the lens barrels.

Figure 1:
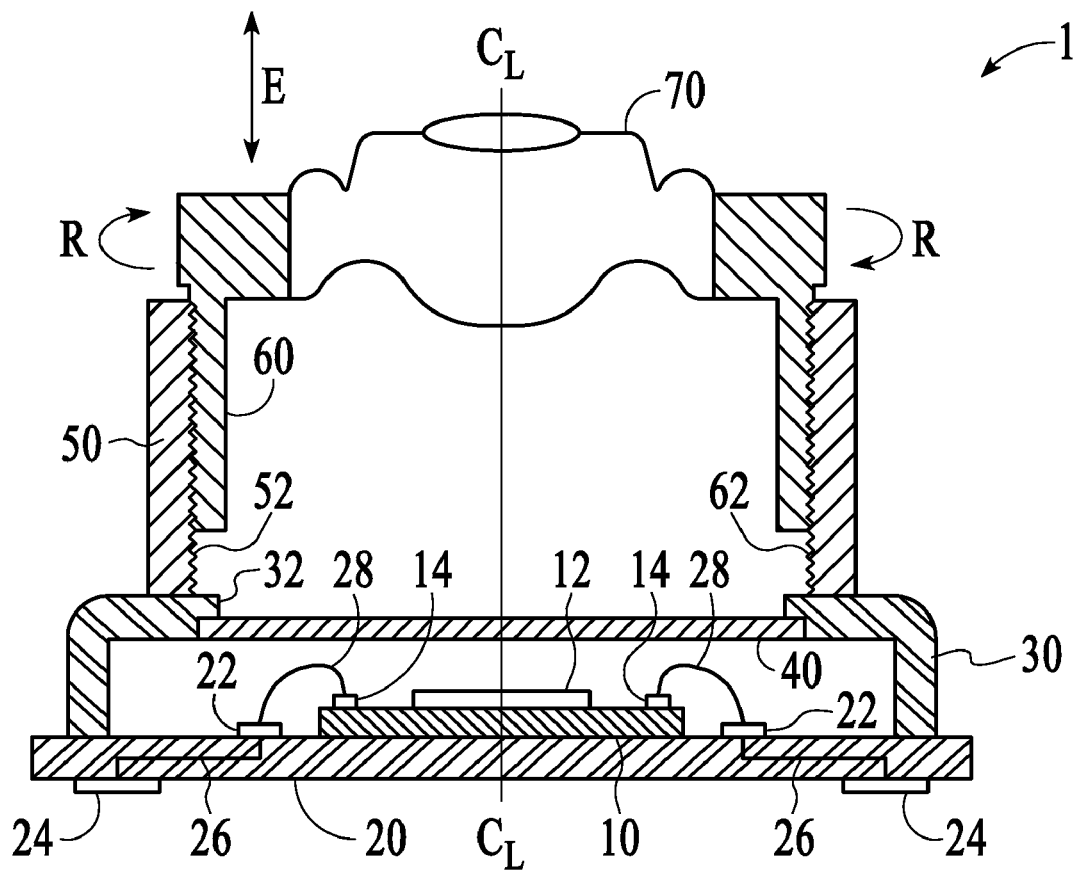
FIG. 1 is a cross-sectional view of an imager module in accordance with the prior art using back focal length adjustment focus methods.
Figure 2:
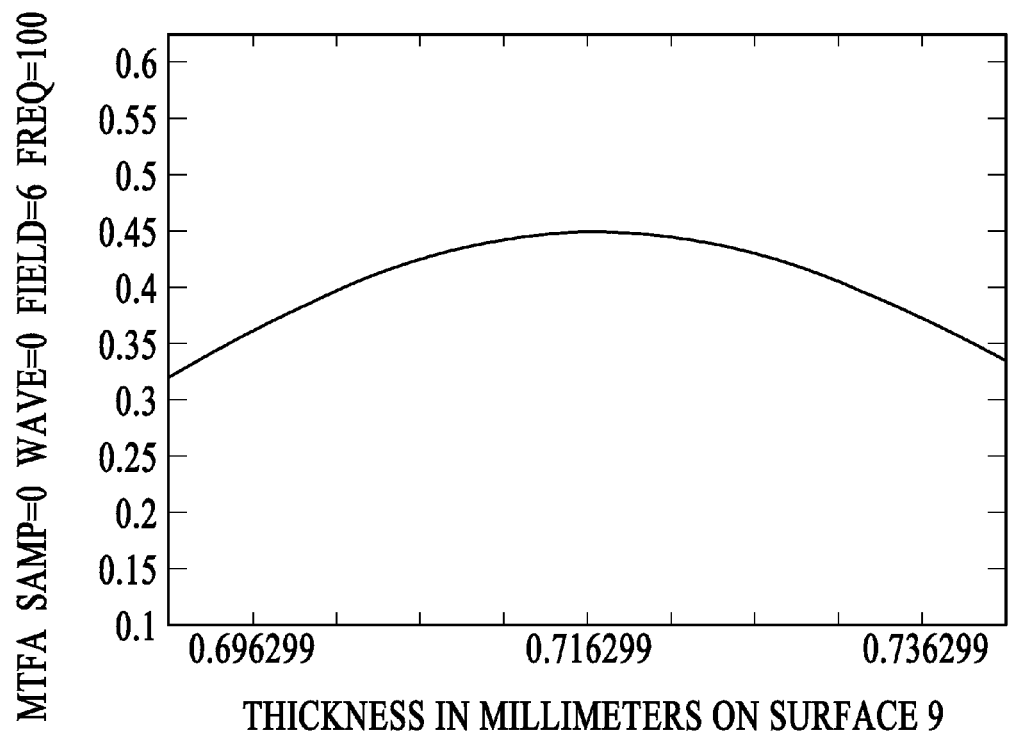
FIG. 2 is a diagram illustrating variation in MTF with change of BFL (40-micron z-axis combined lens group travel) in prior art apparatus.
Figure 3:
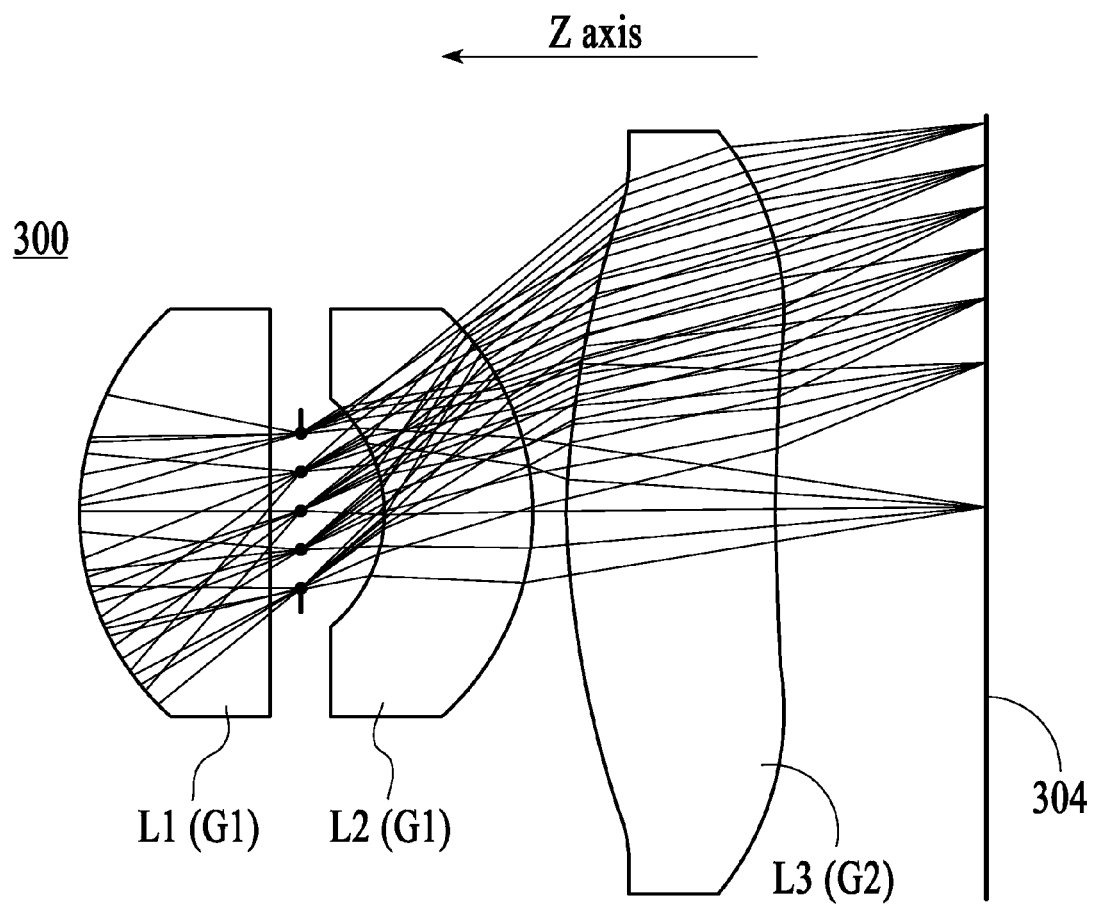
FIG. 3 is a cross-sectional view of a three element optical configuration for an imager module, under an embodiment.

FIG. 3 is a cross-sectional view of a three element optical configuration 300 for an imager module, under an embodiment. An imager module using optical configuration 300 can be used in a compact solid state camera, for example, but is not so limited. Optical configuration 300 includes three lenses L1, L2, and L3 in two or more groups. For example, the optical configuration of an embodiment groups the three lenses L1, L2, and L3 into two groups G1 and G2, but is not so limited. Group G1 is formed by fixing lenses L1 and L2 together. In an embodiment, lenses L1 and L2 have approximately the same diameter. Group G2 includes lens L3 that is closest to (also referred to as being in proximity to) an image sensor focal plane 304. Alternative embodiments can include fewer or greater than three lenses as appropriate to a host device configuration. Furthermore, in alternative embodiments the lenses of the imager module can be grouped in any number of groups and/or configurations. For example, lenses L2 and L3 of optical configuration 300 can be grouped together in one alternative embodiment.

The imager module of an embodiment replaces the BFL focus adjustment using z-movement of the entire optical assembly by a different focus method referred to herein as Lens Group Separation (LGS). Under LGS the optical lenses of the imager module are separated into two separate groups G1 and G2 as described above. In an embodiment, group G1 (also referred to as the upper lens group) is located on the object side, and group G2 (also referred to as the lower lens group) is located on the image side. The imager module is focused by fixing one lens group position along the z-axis and moving the other group along the z-axis relative to the other group. The z-axis is orthogonal to the sensor focal plane 304. Each group, G1 and G2, can have one or more individual lenses.

The LGS focus method of an embodiment can move either lens group relative to the other lens group. The movement of G1 relative to G2 is preferred in some applications because G1 and its focusing mechanism (not shown) are located on an upper or outer surface, making them easily accessible after image module assembly. In alternative embodiments, however, G2 moves relative to G1. The LGS focus method allows the moveable lens group diameter to be smaller than the combined lens element diameter under the BFL focus method. For example, the diameter of lens group G1 of FIG. 3 is significantly smaller than the diameter of group G2 (lens L3), but is not so limited.

Figure 4:
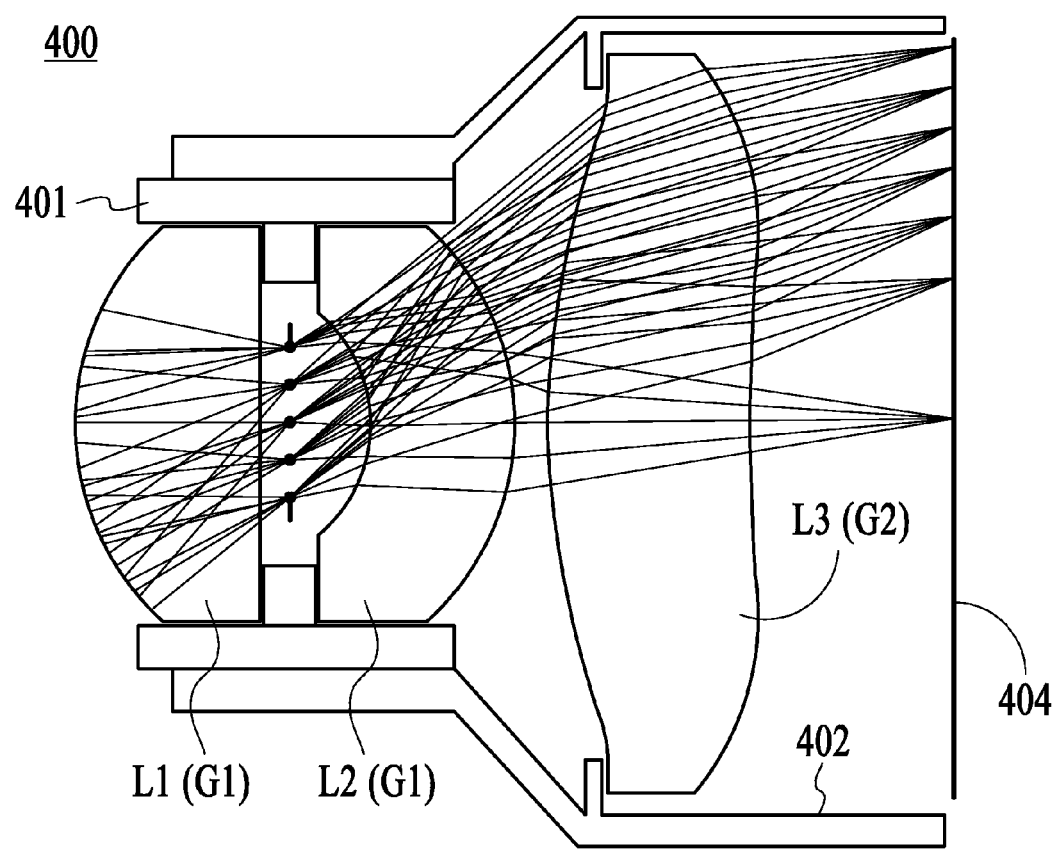
FIG. 4 is a cross-sectional view of an imager module that includes a three-element optical configuration, under an embodiment.

FIG. 4 is a cross-sectional view of an imager module 400, under an embodiment. Imager module 400 implements the LGS focus method described above. Imager module 400 includes a three lens optical configuration similar to optical configuration 300, including lens groups G1 and G2. Imaging module 400 also includes focus mechanism 401, under an embodiment. The imager module 400 includes two groups G1 and G2 of lenses but is not limited to these two groups of lenses, or to three lenses. The lens groups G1 and G2 of imager module 400 can be adjusted by sliding the mechanism 401 in lens barrel 402. Alternatively, mechanism 401 and lens barrel 402 are threaded so that focus is adjusted by rotating lens group G1 in lens barrel 402. Alternatively, the lens groups G1 and G2 of imager module 400 can each be adjusted using a sliding mechanism or threaded mechanism in lens barrel 402 that includes or contains group G2.

During assembly of an imager module, and using imager module 400 as an example, the focus process is automated. In an embodiment, sliding lens group G1 is attached to a transparent handle (not shown) that permits both manipulation of G1 with respect to G2 and viewing through the transparent handle to determine the quality of focus at different G0 locations. The image sensor signal output is monitored during assembly as the G1 lens group is inserted, and lens group movement is stopped once optimum image quality is achieved. As an example, the transparent handle may be fabricated out of sapphire crystal, glass, or plastic, but embodiments are not so limited. When an optimum focus is achieved, the lens group G0 is fixed in place. For example, in an embodiment the lens group G1 is fixed to the lens barrel using a curable (e.g. UV, thermal, etc.) glue or resin. The imager module 400 assembly thus includes the G1 lens group focus mechanism (sliding or threaded) inserted into the G2 lens group barrel 402 (sliding or threaded). The imager module 400 of an embodiment also includes an imager integrated circuit ("IC") or imaging die (not shown) that receives the light through lens groups G1 and G2 onto an image sensor focal plane 404.

Figure 5:
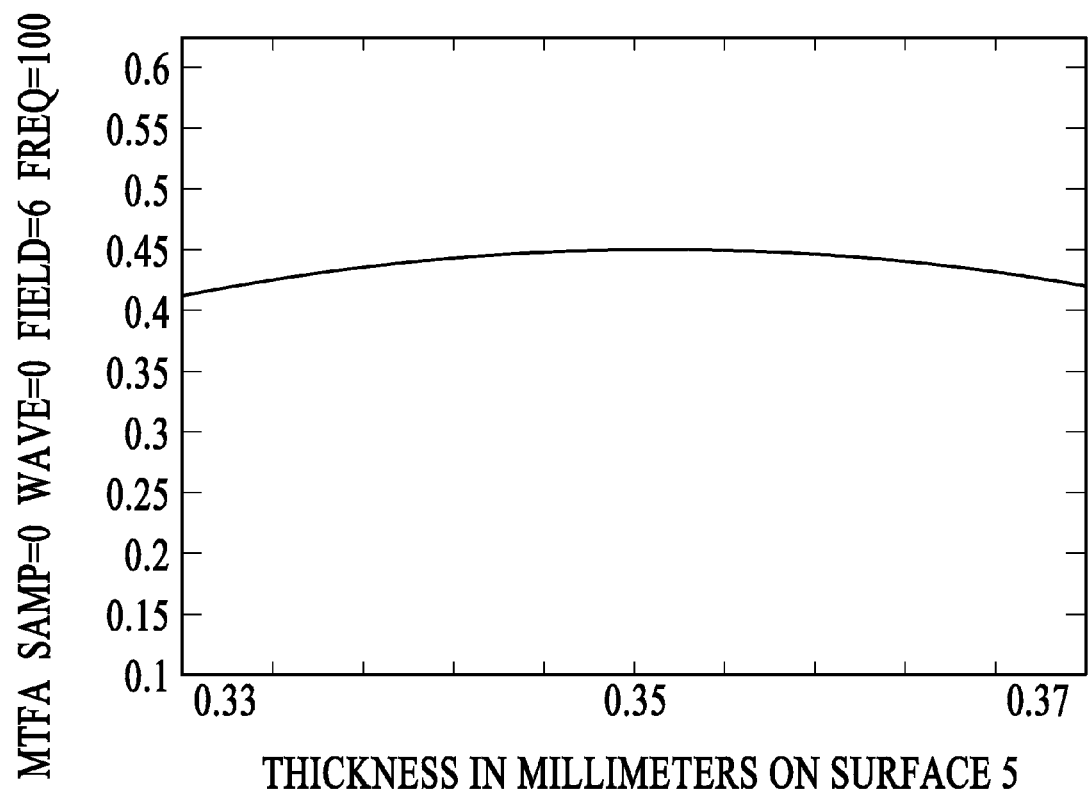
FIG. 5 is a diagram illustrating variation in MTF with change of LGS (40-micron z-axis lens group separation travel), under an embodiment.

A three-element optical configuration similar to those described with reference to FIGS. 3 and 4 was analyzed and used to predict MTF focus performance with the LGS focus method of an embodiment. In this analysis, the two object side (upper or outer) lenses L1 and L2 were moved together in the z-axis relative to the lower lens group (lens L3, the closest lens to the imager). FIG. 5 is a diagram that illustrates the relative improvement in MTF variation using the LGS focus method, under an embodiment. An MTF better than 0.4 is achieved for example with the LGS focus method with ±20 microns z-axis lens group travel. In addition, a smaller variance in MTF over the measured range is observed with the LGS method than with the BFL method.

Figure 6:
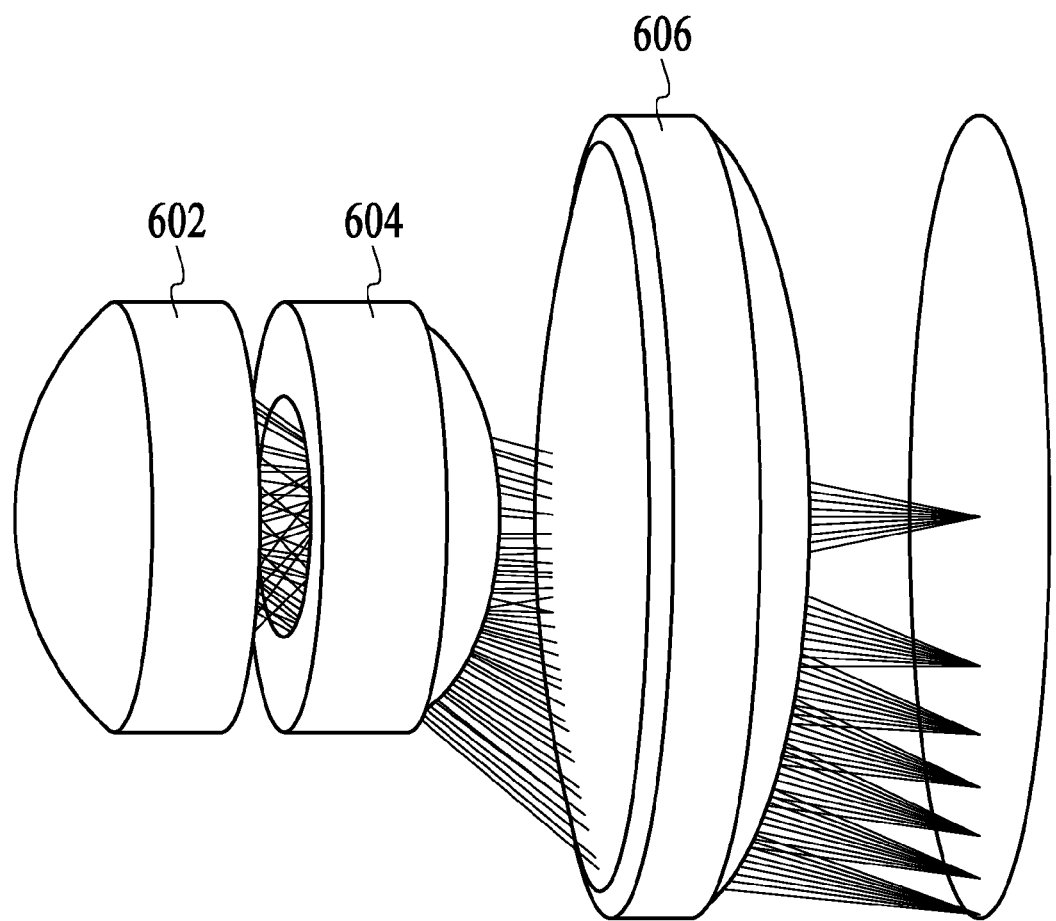
FIG. 6 is a diagram illustrating three lens optical configuration surface contours, under an embodiment.

The LGS focus method of an embodiment can be used with a variety of optical configurations. The number of lenses in either lens group can be one or more. The lenses can be refractive or diffractive. The lens surfaces can be spherical or aspherical. The lens material can be plastic, glass and/or other optical materials suitable for the intended wavelength imaging. As one example, FIG. 6 is a diagram of a three lens optical configuration 600 with surface contours configured for visible imaging, under an embodiment. The optical configuration 600 includes lenses 602 and 604 in one lens group, and lens 606 in another lens group, but is not so limited. The surfaces of lenses 602, 604 and 606 in optical configuration 600 are aspheres, and the lens material is plastic for each lens but other surfaces and/or materials can be used. The optical configuration 600 can include a wavelength filter (optional) to pass a certain wavelength band or to block a wavelength band but is not so limited. The optical configuration 600 can be used in an imager module as described herein, such as imager module 400 for example.

Following are descriptions of several embodiments of an imager module, optics configurations, methods of optical focus, methods of component alignment and assembly, and methods for forming electrically conductive interconnects to the microelectronic imager. One embodiment is directed toward an imager module (configured for use in a solid state camera for example) comprising an image sensor with a single imaging area array including multiple photosites, and associated optics. The optics associated with an imaging area are also referred to as an optics channel, an optical channel, an imaging channel, or a channel.

Other embodiments described below are directed toward an imager module comprising an image sensor with multiple imaging area arrays, each of which contains a plurality of photosites, and an associated optics channel. The image sensor can alternatively be referred to as a sensor, an imager, an imager die, an image capture device, and/or an imaging device. Yet another embodiment described below is directed towards an imager module that includes both the imager circuitry and an image signal processor and camera functions.

Figure 7:
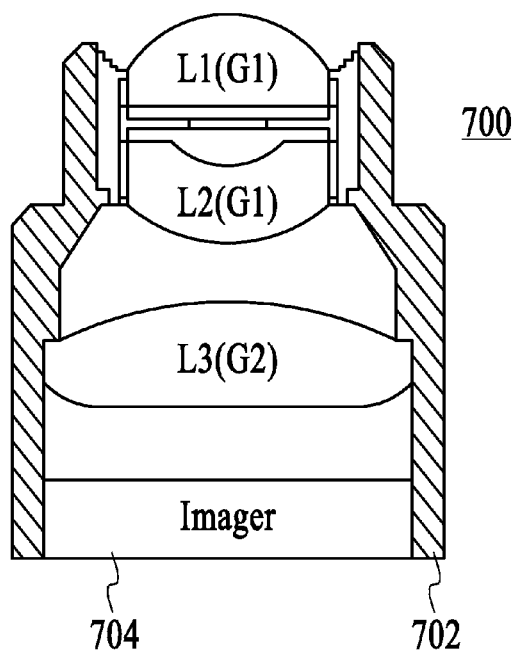
FIG. 7 is a cross-sectional view of a single channel imager module, under an embodiment.

FIG. 7 is a cross-sectional view of a single channel imager module 700, under an embodiment. Imager module 700 includes a lens barrel 702. The image module 700 includes a movable lens group G1 (lenses L1 and L2), and a fixed lens group G2 (lens L3). The lens barrel 702 holds lens group G2. The lens barrel 702 is fixed to edges of an imager die 704. The lens barrel 702 is attached to the imager die 704 using techniques known in the art. In operation, the lens group G1 is moved relative to the fixed lens group G2 to focus the camera. This embodiment results in a relatively small footprint of imager module 700. For example, the footprint is not much larger than the footprint of the imager die 704. The LGS focus mechanism described above, when used in imager module 700, provides for a high MTF with a wider range of focus adjustment relative to the BFL focus method.

Figure 8:
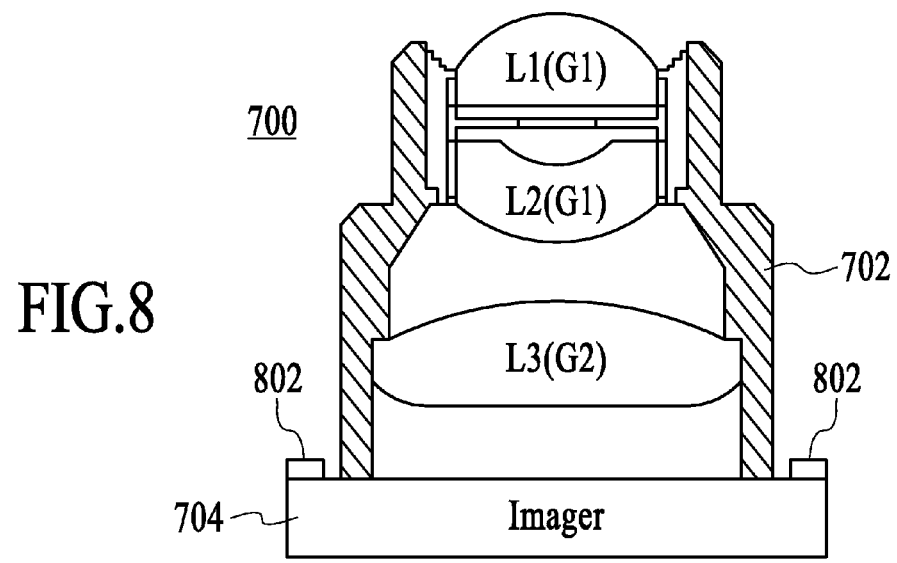
FIG. 8 is another cross-sectional view of a single channel imager module rotated 90 degrees, under an embodiment.

FIG. 8 is a cross-sectional view of imager module 700 rotated ninety (90) degrees, under an embodiment. Imager bond pads 802 are located at the edges of the imager die 704. The lens barrel 702 is coupled or attached to a surface of the imager die 704 adjacent to the bond pads 802 to allow access to the bond pads 802 for electrical interconnection. The electrical interconnection can be accomplished by wire bonding or bump bonding as known in the art. External lead frames and packaging techniques can also be applied. The imager die bond pads 802 can be located such that the regions near the edges do not contain bond pads. This allows the lens barrel 702 to mechanically register to all four corners on the imager die 704. The edges of the lens barrel 702 can be glued or bonded to the imager die 704 in an inert ambient or vacuum to create a hermetic seal. Attachment of the lens barrel 702 directly to the imager die 704 provides a relatively small imager module footprint (not much larger than the imager die 704). Alternatively, a substrate can be used where space considerations are not a factor.

Figure 9:
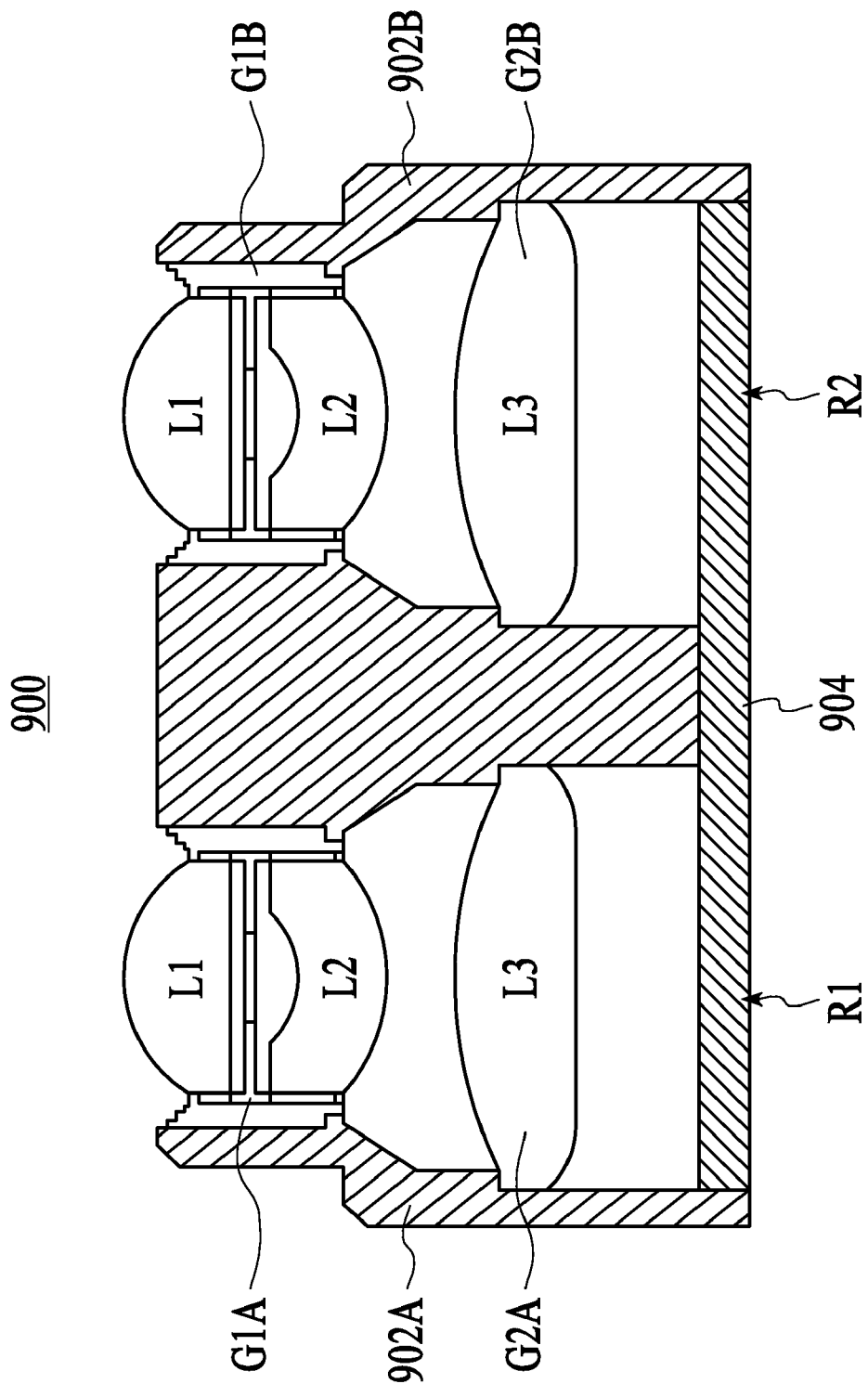
FIG. 9 is a cross-sectional view of a two channel imager module, under an embodiment.

FIG. 9 is a cross-sectional view of a two channel imager module 900, under an embodiment. Imager module 900 includes two lens barrels 902A and 902B located over separate imaging regions R1 and R2 of an imager die 904. Lens barrel 902A holds one optical channel that includes lens group G1A (lenses L1 and L2), and lens group G2A (lens L3). Lens barrel 902B holds another optical channel that includes lens group G1B (lenses L1 and L2), and lens group G2B (lens L3). Each lens barrel 902 attaches or couples to edges of the imager die 904. Each of lens groups G1A and G1B is moved relative to its respective fixed lens group G2 in order to focus the camera. Each optical channel of the imager module 900 is focused independently to optimize MTF in each channel. The number of channels of the imager module 900 can be extended (in both x and y axes) to provide more than two optical channels.

In an embodiment, a lens frame and spacer (not shown) extends between each optical channel to eliminate optical crosstalk between channels. In an embodiment, the electrical connections of the imager module 900 are made as described above with reference to FIG. 8. As described above, a footprint of the multi-channel imager module 900 is small relative to conventional imager modules. Use of the LGS focus mechanism described above in imager module 900 provides for high MTF in each channel with a wider range of focus adjustment than the BFL focus method.

Figure 10:
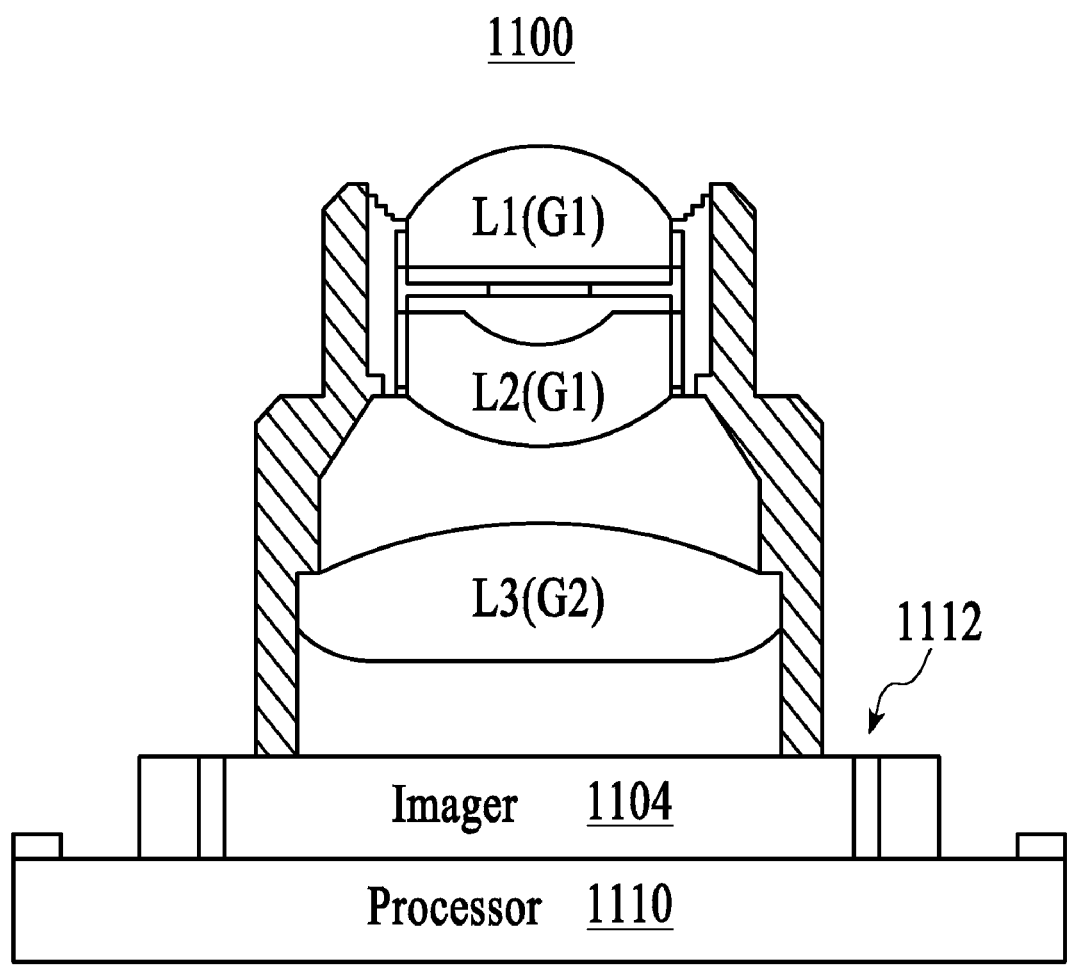
FIG. 10 is a cross-sectional view of an imager module and signal processor, under an embodiment.

FIG. 10 is a cross-sectional view of a single channel imager module 1100 coupled to an associated signal processor 1110, under an embodiment. The signal processor or "processor" includes analog and/or digital circuitry as appropriate to provide solid-state camera functionality. Imager module 1100 includes a single imaging channel, but the processor of various alternative embodiments can couple to an imager die having multiple imaging channels. Electrical vias 1112 are included from the imager 1104 (e.g. imager IC or imager die) to the processor 1110. The vias 1112 through the imager die 1104 to the processor 1110 can be generated using conventional IC process techniques. The substrates or wafers of the imager 1104 and processor 1110 can be bonded together and vias produced. Alternatively, an individual imager die can be bonded to the processor wafer and vias produced. Such three-dimensional integrated circuit processing is commercially available from companies such as Ziptronix for example.

Imager module 1100 includes the frame (not shown) attached to the imager die. However, accurate wafer bonding allows repeatable placement of the imager onto the processor wafer in x, y and z axes such that a frame can attach directly to the processor die if desired. The frame can attach to all four edges of the imager die if desired since the vias eliminate the need for wire bonding the imager die. The electrical interconnection to the processor die can be accomplished by conventional wire bonding or bump bonding methods.

Figure 11:
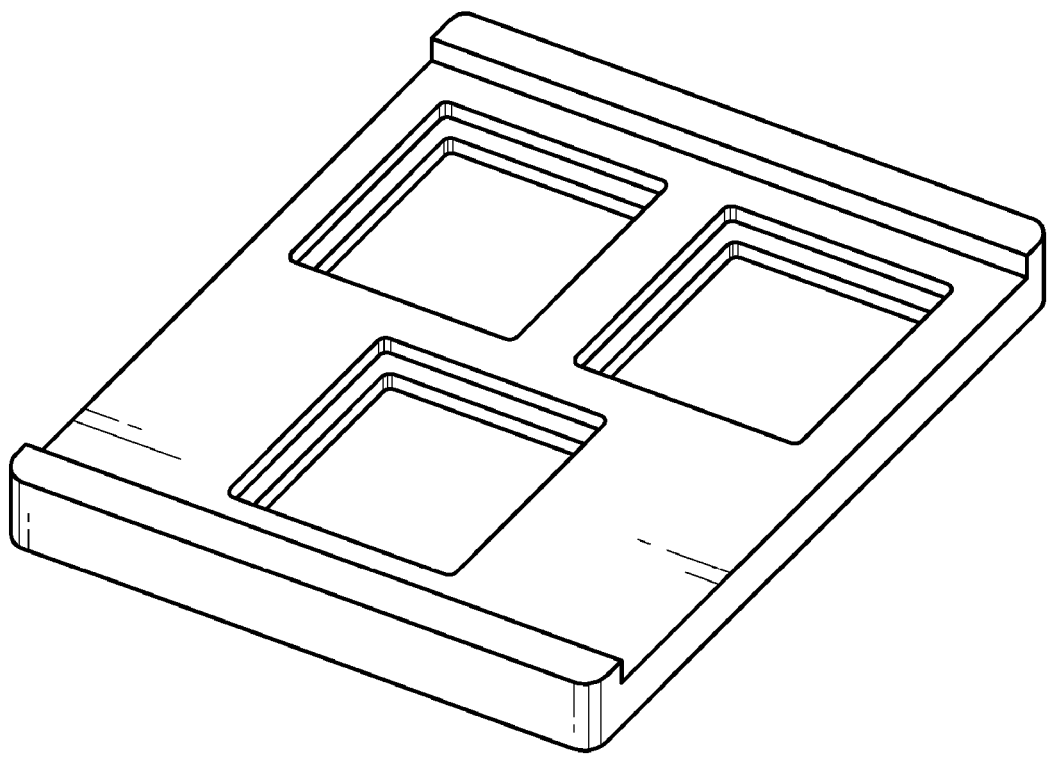
FIG. 11 is an isometric view of a solid state camera optics frame with three channels, under an embodiment.

FIG. 11 is an isometric view of a solid state camera optics frame 1001 with three channels, under an embodiment. The optics frame 1001 is used to construct part of an imager module. In such an embodiment, the optics frame 1001 provides openings for three separate imaging regions as shown. An imager module using this three channel optical configuration can be used in a compact solid state camera, for example, but is not so limited.

Figure 12:
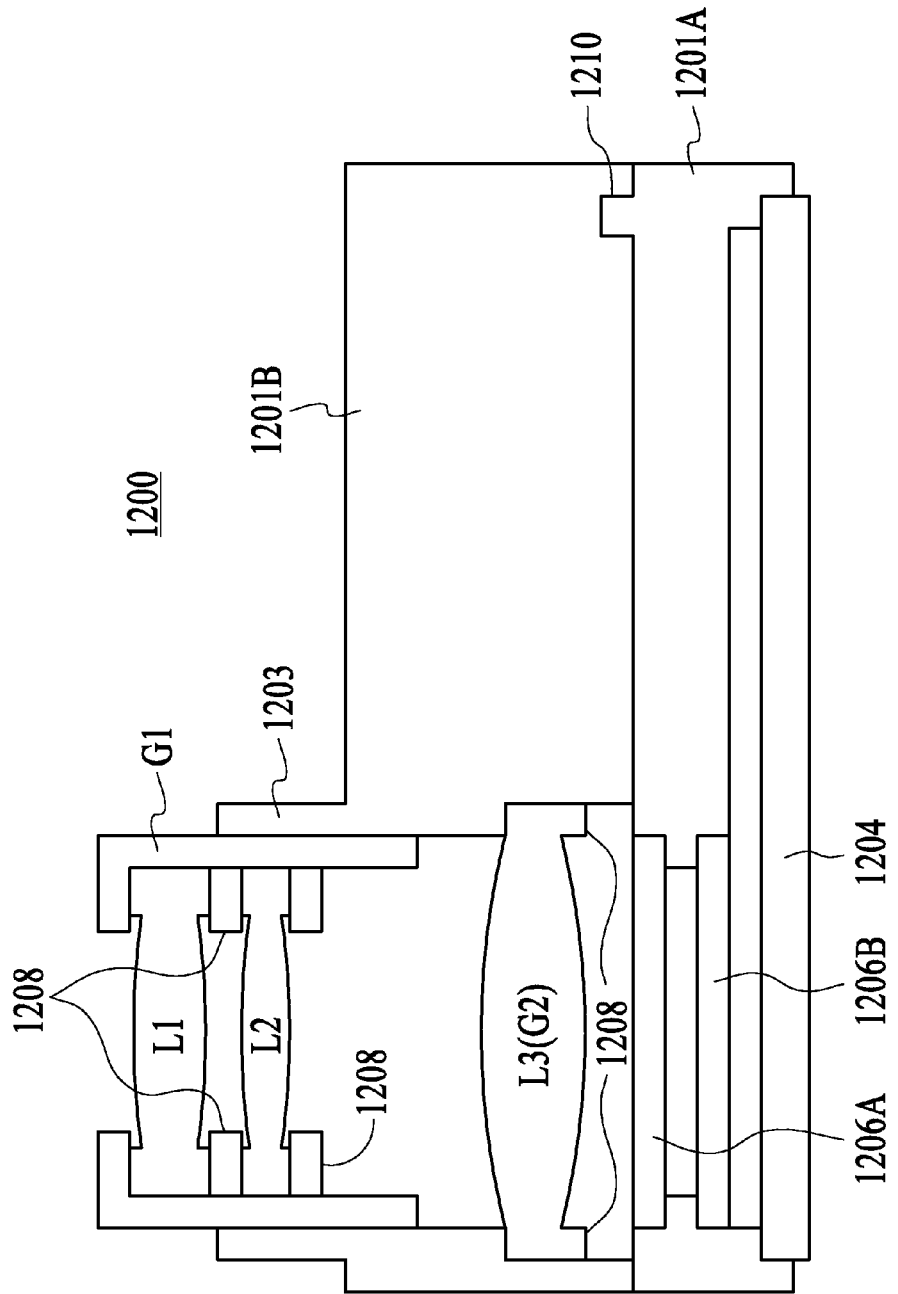
FIG. 12 is a cross-sectional view of part of an imager module, under an embodiment.

FIG. 12 is a cross-sectional view of part of an imager module 1200, under an embodiment. The imager module 1200 includes an optics frame 1201. In an embodiment, the optics frame 1201 has two parts, a lower part 1201A, which is substantially similar to optics frame 1001, and an upper part 1201B. In other embodiments, the upper and lower parts of the optics frame are a single piece 1201.

The optics frame 1201A is attached to an imager die 1204 by any of the methods known or previously described herein. In an embodiment, the optics frame 1201A includes optional filters 1206A and 1206B, but is not so limited. The optics frame 1201A also includes one or more reference features 1210 for registering the optics frame with a mating component.

The optics frame 1201B, in an embodiment, includes a lower lens group G3 that includes a lens L3 as previously described. Lens L3 is retained in the optics frame 1201B with one or more retainers 1208, but embodiments are not so limited. The optics frame 1201B further includes a lens barrel portion 1203. In an embodiment, a lens group G1 including a lens L1 and a lens L2 is inserted in the lens barrel portion 1203. The lens group G1 includes retainers 1208 for retaining the lenses L1 and L2 in a fixed position with respect to each other, while allowing movement of the entire lens group G1 with respect to the lens group G2. In various embodiments, the lens group G2 is slidable in the lens barrel 1203. Alternatively, the lens group G1 and the lens barrel portion 1203 are each threaded to allow movement of lens group G1 toward or away from lens group G2 by rotation about the central axis of the lens barrel portion 1203. In yet other embodiments, lens group and/or lens group G2 include more than two lenses or less than two lenses. In other embodiments, lens group G2 is moveable and lens group G1 is not moveable, or both of lens groups G1 and G2 are moveable.

Figure 13A:
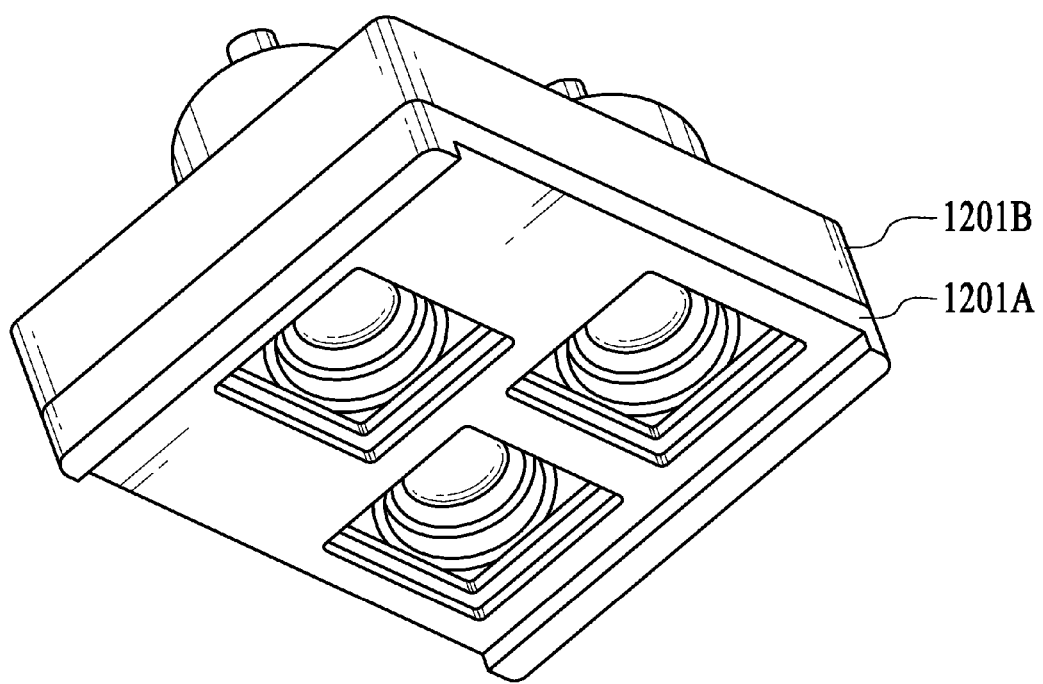
FIG. 13A is an isometric view of an imaging module including an optics frame assembled with three lens group assemblies, under an embodiment.

FIG. 13A is an isometric view of an imaging module 1300 including an optics frame 1200 assembled with three lens group assemblies, under an embodiment. The view of FIG. 13 is toward the bottom of the optics frame 1201A looking through lenses of the three assembled optics channels shown. Part of the optics frame 1201B is visible at the top of the module 1300. In an embodiment, the imaging module 1300 includes an imager die (not shown) coupled to the optics frame 1200.

Figure 13B:
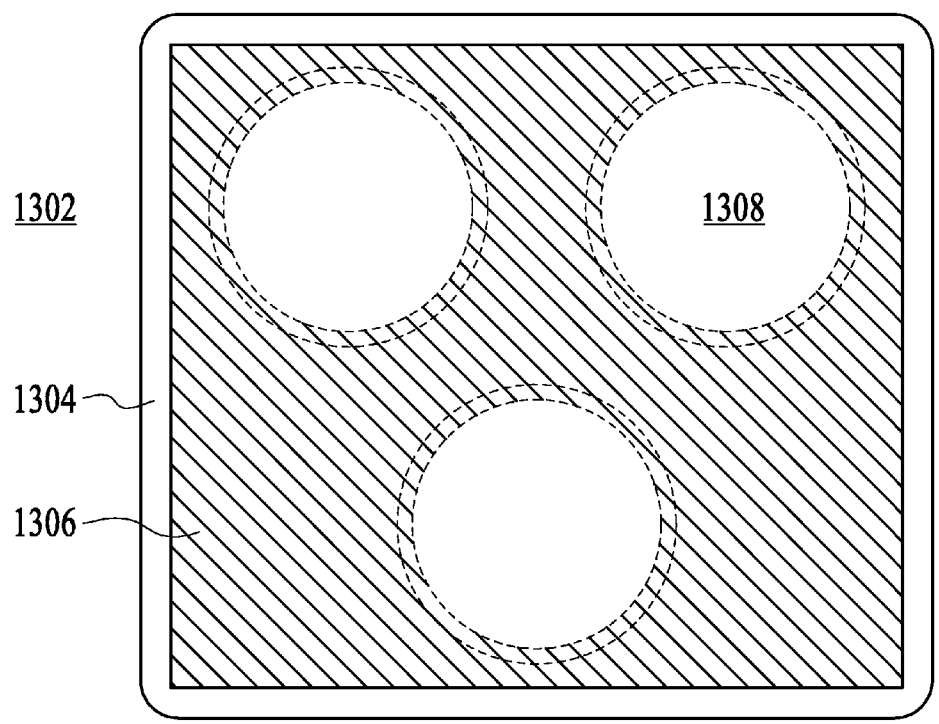
FIG. 13B is a top view of an upper portion of a multi-part lens frame, under an embodiment.
Figure 13C:
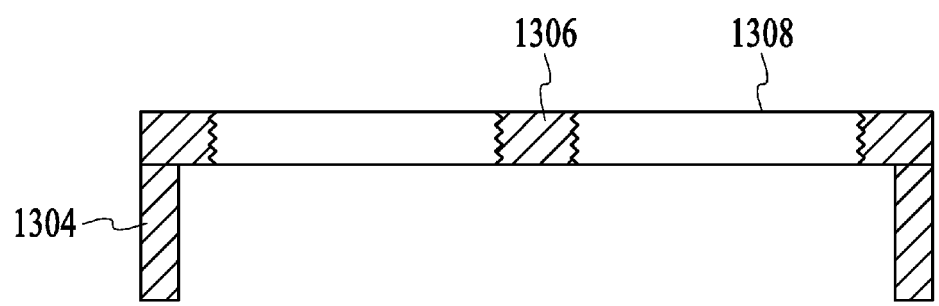
FIG. 13C is a side view of the upper portion of the multi-part lens frame of FIG. 13A.

In one embodiment, the imaging module 1300 includes a multi-part optics lens frame that holds the lens barrels holding the lens groups at a specified distance relative to the imager die. FIG. 13B is a top view of an upper portion of a multi-part lens frame, under an embodiment. Lens frame 1302 comprises an upper part of a lens frame assembly, and includes an outer perimeter structure 1304 that extends downward to contact a lower portion of the frame assembly. The upper part 1302 includes a lens barrel support surface 1306, which includes a number of holes or cavities 1308 to accommodate the insertion or mounting of individual lens barrels. In one embodiment, the lens barrel holes 1308 are threaded to provide rotatable coupling to a threaded sleeve of a corresponding lens barrel. Any number of lens barrel holes 1308 may be provided depending upon the number of lenses or lens groups that are mounted within the lens assembly. FIG. 13C is a side view of the first portion of the multi-part lens frame of FIG. 13A. FIG. 13C illustrates a cross section of the lens holes 1308 through the lens barrel support surface 1306, and the extension of the perimeter structure 1304 downward from surface 1306.

Figure 13D:
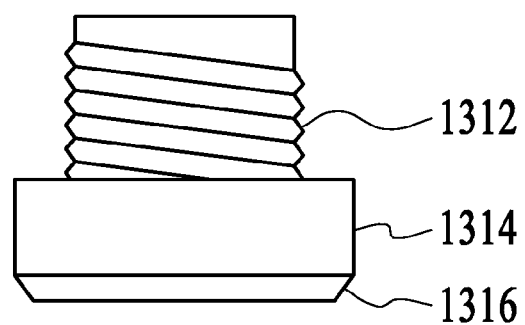
FIG. 13D is a side view of a lens barrel for use in a lens frame, under an embodiment.

FIG. 13D is a side view of a circular lens barrel used in conjunction with the upper portion of the lens frame 1301. In one embodiment, the lens barrel 1310 comprises a threaded shaft portion 1312 coupled to a body portion 1314. One or more lenses, such as lenses L1, L2, and L3 shown in FIG. 4 can be fixed within either or both of the shaft 1312 or body portion 1314 of lens barrel 1310. The threaded section 1312 is rotatably inserted into the frame to allow some degree of vertical adjustment within the upper portion 1302 of the frame assembly. This allows adjustment of the lens or lenses within the barrel 1310 relative to the focal plane defined by the imager die. Thus, each lens is held in a respective lens barrel that is screwed into the frame assembly that holds the lens at a prescribed distance above the major surface of the imager die. For the embodiment shown in FIG. 13D, the body portion 1314 of the lens barrel 1310 features an annular bottom surface that is chamfered or beveled. In an alternative embodiment, the shaft portion of lens barrel 1310 can be smooth instead of threaded. For this embodiment, the lens barrel is friction fit within a corresponding lens barrel hole in the frame. The lens barrel can be permanently fixed within the lens barrel hole at a specified position by adhesive, a mechanical stop mechanism, or friction. In the case of a smooth shaft lens barrel, a slot/tab or similar key structure can be provided between the mating surfaces of the lens barrel shaft and lens barrel hole to fix the lens barrel to prevent twisting of the lens barrel during height adjustment within the frame.

Figure 13E:
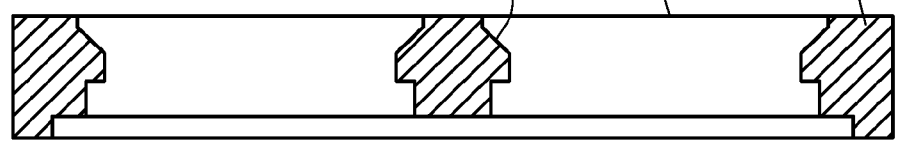
FIG. 13E is a side view of a lower frame portion for use with the upper portion of FIG. 13B, under an embodiment.

In one embodiment, the multi-part lens frame assembly includes a subframe assembly or lower frame portion that is disposed between the upper frame portion and the sensor die and that supports the upper frame portion along its perimeter. The subframe separates the bottom portion of each lens barrel from the imager die at a fixed distance defined, in part, by the thickness of the subframe. FIG. 13E is a side illustration of a lower frame portion, or frame subassembly, that is used in conjunction with the upper frame portion 1302, under an embodiment. The lower portion 1318 includes a solid structure 1320 that supports the upper portion 1302. The support structure has individual circular cutouts or void areas 1322 corresponding to each lens barrel to allow transmission of light from the lens barrels onto respective imaging areas on the imager die. The support structure surrounding the cutouts for each lens barrel feature annular chamfered surfaces 1317 that match the chamfer 1316 at the bottom of each lens barrel.

Figure 13F:
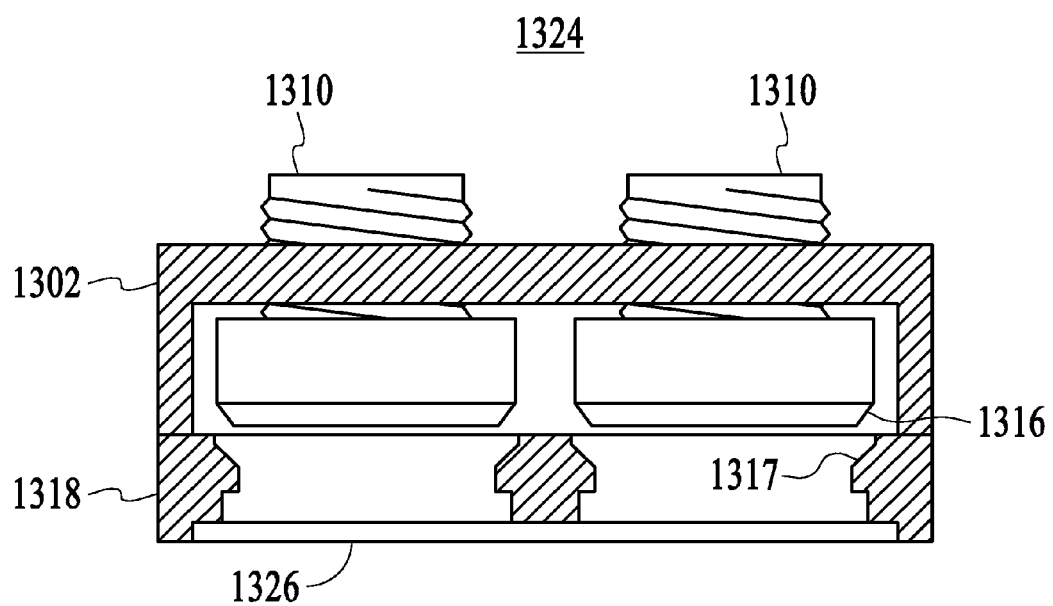
FIG. 13F is a side-view illustrating a multi-part lens frame assembly comprising upper and lower frame portions, under an embodiment.

FIG. 13F is a side-view illustrating an optical frame assembly comprising upper and lower frame portions, under an embodiment. Frame assembly 1324 shows a frame assembly in which one or more lens barrels 1310 are fixed in the upper portion 1302, and the upper portion is placed onto the lower portion 1318. The lower portion 1318 holds an imager die 1326 that is imaged by the lenses in lens barrels 1310. The distance of the bottom surface of the lens barrels 1310 from the imager die 1326 is adjustable by screwing the lens barrel into the frame for a specified number of turns. Depending upon use and production constraints, the lens barrels can be set to the optimum height relative to the sensor die during production of the optics assembly, and once adjusted, are glued or otherwise permanently fixed into place. In the event that a lens barrel is deployed below the plane defined by the bottom of the frame, the chamfered surface 1316 of the bottom of the lens barrel is stopped by the chamfered surface 1317 of the subframe cutouts to prevent the lens barrel from coming into contact with the imager die.

In normal production configurations, the lens barrels are positioned above the subframe by a defined gap (e.g., on the order of 0.35 mm) relative to a lens barrel height of (e.g., 1.4 mm) for a total frame to subframe distance of around, for example 1.75 mm. In one embodiment, the lower portion 1318 of the frame assembly is open with respect to the areas between the lens barrels and has no full-height partitions or structures between the lens barrels. The frame is seated on top of a subframe that separates the sensor die from the bottom surface of each lens barrel. The gap created between the respective chamfered surfaces 1316 and 1317 can allow a certain amount of light to migrate between the imaging regions defined by the separate lenses and the subframe structure, depending upon specific applications and configurations. If necessary, this gap can be minimized by extending the solid structure 1317 of the lower portion 1318 upward relative to the lens barrels, or by introducing partitions that partially or wholly block light between the imaging areas for each lens barrel and prevent optical cross-talk between the imaging areas.

Although the embodiment of FIG. 13F illustrates lens barrels 1310 that have threaded shafts, as mentioned above, these shaft portions can be smooth and friction fit within the lens barrel holes of upper frame portion 1302. During production, the lens barrels can be slid to a desired position relative to the imager die and fixed in place with an adhesive or mechanical stop.

Figure 13G:
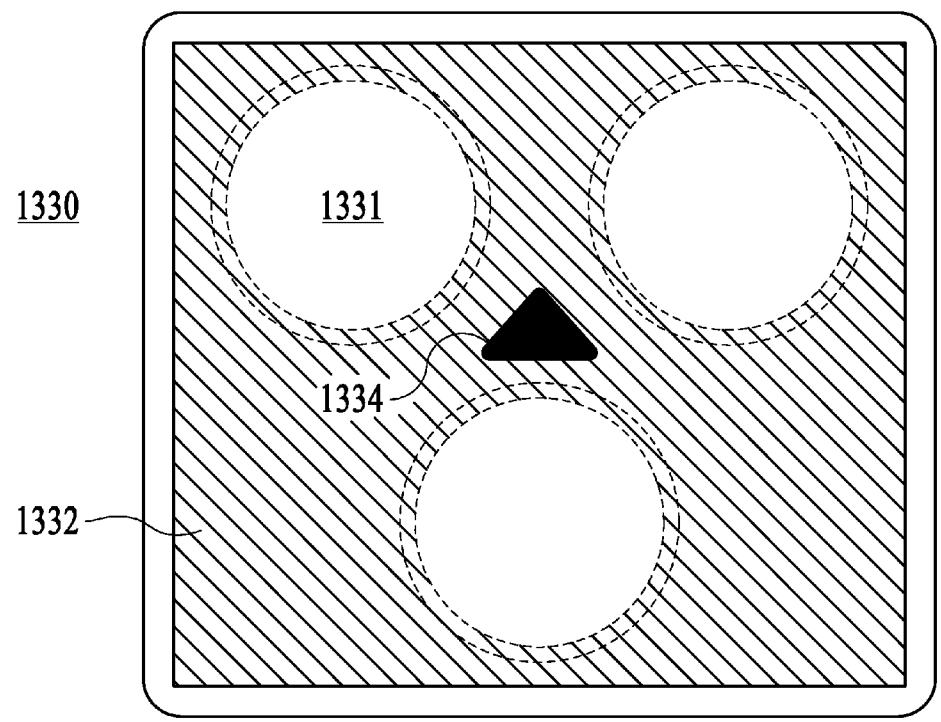
FIG. 13G is a top view illustration of a unitary lens frame assembly having a central support structure, under a first embodiment.

For frame assemblies that comprise an upper and lower frame portion, different variations of the lower frame that provides a mounting surface for the upper portion and holds the substrate a fixed distance from the imaging lenses, and that provide a relatively open area between the substrate and the frame surface are possible. FIG. 13K is an isometric view of a subframe assembly having a central support structure, under an alternative embodiment. As shown in FIG. 13K, a central support structure 1344 comprises a rectangular structure that is connected to the perimeter structure 1342. This configuration provides at least three open areas for passage of light from the lenses held by the upper frame portion and the substrate. For embodiments in which full shielding of light between the imaging areas is desired, the rectangular structure 1344 can be extended so that it contacts the opposite sides of the perimeter structure 1342 to provide a full partition between each neighboring imaging area.

In an alternative embodiment, the frame assembly that holds the imaging lenses comprises a single structural portion that holds both the lens barrels and the imager die. The frame assembly includes a perimeter structure as well as a central support structure to maintain an accurate gap between the lenses and the top surface of the imager die, and provide adequate support for the lens barrels. FIG. 13G is a top view illustration of a unitary frame assembly having a central support structure, under a first embodiment. Frame assembly 1330 comprises an upper support surface 1332 with cutouts 1331 for holding a plurality of lens barrels. A support structure 1334 protrudes from the bottom side of the upper support surface to provide a central load bearing support for the frame assembly 1330, and extends downward so that it rests on the upper surface of the imager die.

Figure 13H:
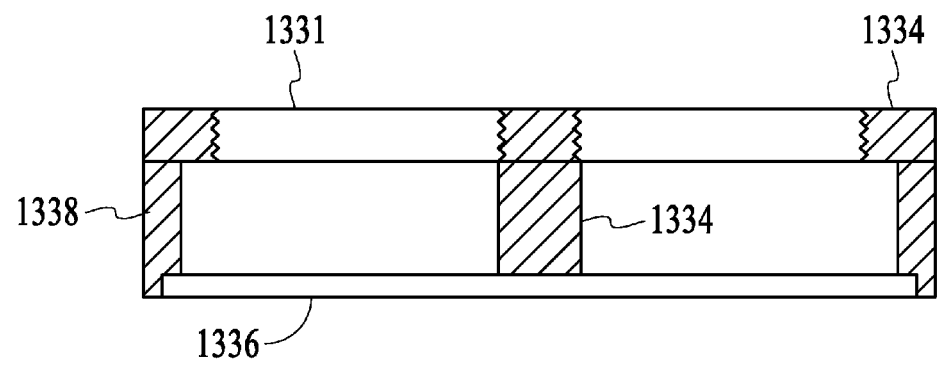
FIG. 13H is a side view of the unitary lens frame assembly of FIG. 13G.

FIG. 13H is a side view of the unitary frame assembly of FIG. 13G. As shown in FIG. 13H, frame assembly 1330 holds the one or more lens barrels in holes 1331 through the upper surface 1334, as well as the substrate 1336. The area under the upper surface 1334 is essentially empty except for the central portion between the lens openings 1331, which is occupied by the central support structure 1334. The central support structure 1334 as well as the perimeter portion 1338 of the frame assembly provide the spacing between the imaging lenses and the imager die 1336. The cross-sectional shape and size of the central support structure 1334 can be configured in accordance with the constraints and requirements of the frame assembly and imaging system. For the example embodiment illustrated in FIGS. 13G and 13H, structure 1334 is shown as a post with a cross-sectional area. As can be appreciated by those of ordinary skill in the art, many other types of cross-sectional shapes can be used, such as circular, rectangular, square, cross-shaped, or other polygonal shapes. In addition, webbing or other extensions can be added to the structure to increase support strength and/or light blockage between the imaging areas defined by the lens barrels.

Figure 13I:
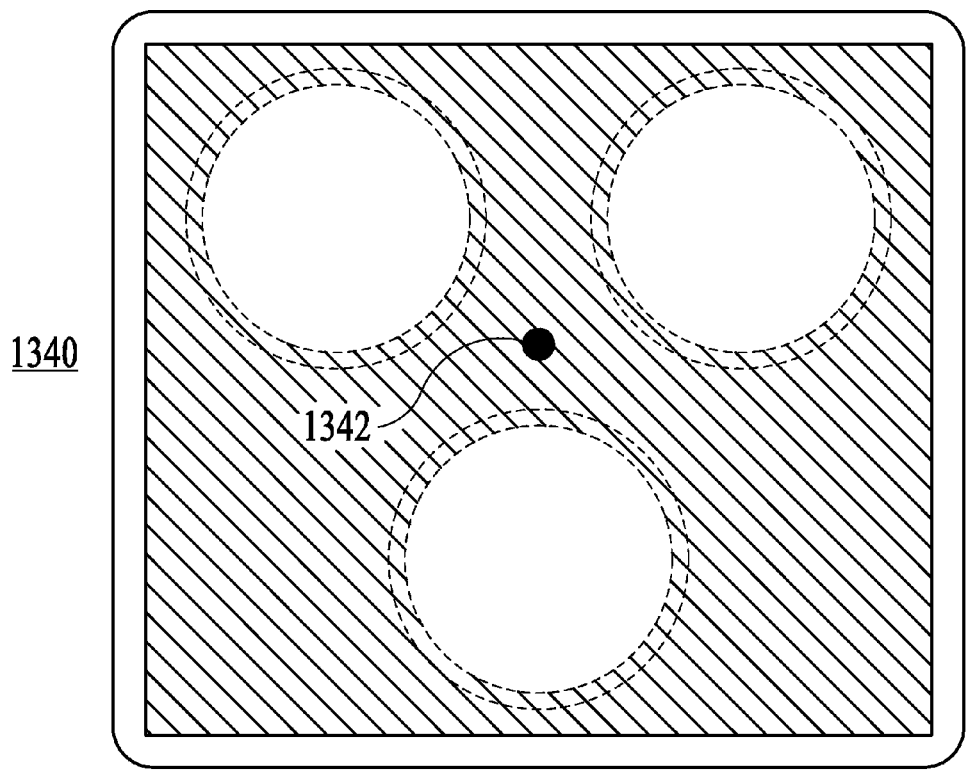
FIG. 13I is a top view of a unitary lens frame assembly having a central support structure, under a second embodiment.
Figure 13J:
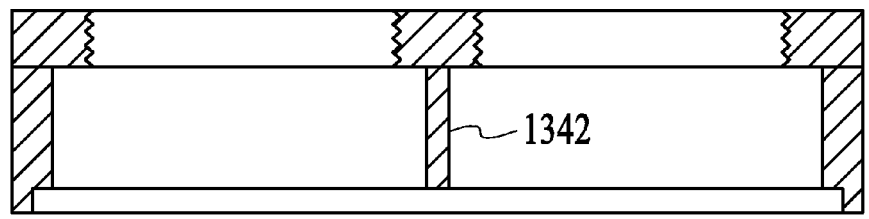
FIG. 13J is a side view of the unitary lens frame assembly of FIG. 13I.
Figure 13K:
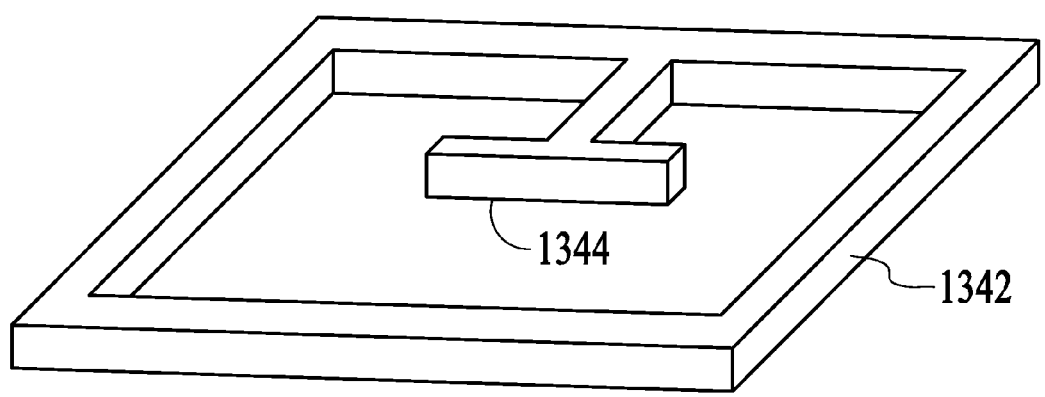
FIG. 13K is an isometric view of a subframe assembly having a central support structure, under an embodiment.

In certain circumstances, the distance between the imaging areas may be sufficiently great so that light leakage among the imaging areas is not significant enough to cause image degradation. In this case, the support structure can be only enough to provide support for the central portion of the upper surface. FIG. 13I is a top view illustration of a unitary frame assembly having a central support structure, under a second embodiment. The frame assembly 1340 of FIG. 13I has a central support structure 1342 that is a small-diameter cylindrical post. FIG. 13J is a side view of the unitary frame assembly of FIG. 13I. The diameter of the post 1342 can vary depending upon the structural requirements of the frame assembly, as well as other factors, such as manufacturing constraints.

Although embodiments illustrated in FIGS. 13B-13H are illustrated with respect to a frame assembly that holds three lens barrels, it should be noted that such lens assemblies can be configured to hold any number of lens barrels (e.g., four or more) depending upon the constraints and requirements of the imaging system.

Figure 14:
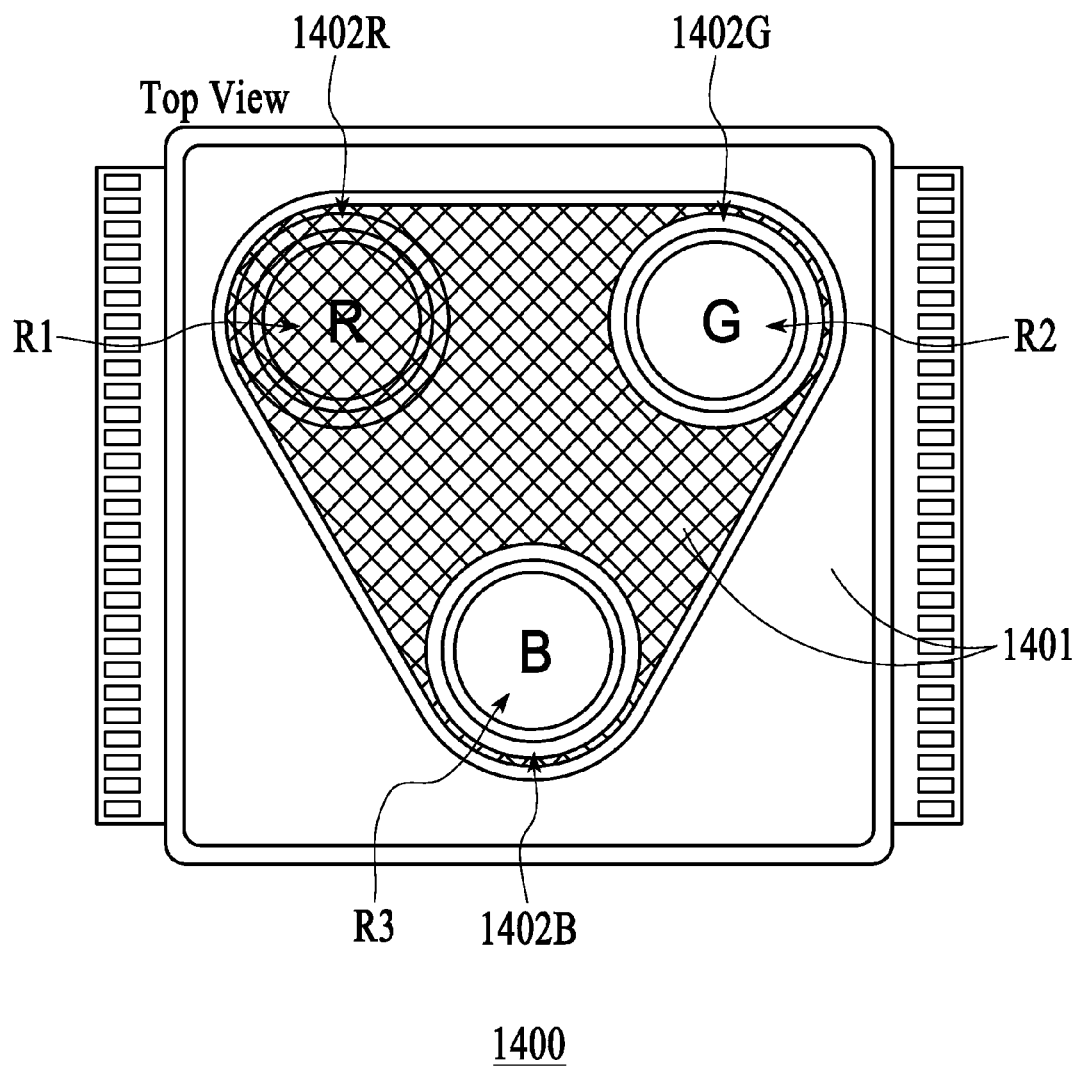
FIG. 14 is a top view of a three channel imager module, under an embodiment.

FIG. 14 is a top view of a three channel imager module 1400, under an embodiment. The lens frame of imager module 1400 includes an optical frame 1401 with three lens barrels 1402R, 1402G, and 1402B that provide three independent optical channels. The optical frame can be configured as shown in any of the embodiments illustrated in FIGS. 13A-13K, or it could be any frame that is suitably configured to provide a support structure for the optical lenses relative to the imager die. As shown in FIG. 14, the three lens barrels 1402R, 1402G, and 1402B are positioned over separate imaging regions R1, R2, and R3 on an imager die. Each optical channel includes, for example, lenses L1, L2, and L3 configured in groups G1 and G2 as described above, but is not so limited. For each optical channel, a lens L3 (fixed lens group G2) as described above attaches or couples to the imager die edges. For each optical channel, a lens group G1 is moved relative to the fixed lens group G2 to focus the camera, but is not so limited. Each optical channel of imager module 1400 can be focused independently to optimize MTF in each imaging channel but is not so limited. Imager module 1400 is a three color RGB camera but is not limited to a RGB camera. Each of the three channels of imager module 1400 can be configured to image different colors, for example other color bands, or the same colors. For example, the three channels can each provide RGB imaging capability with a Bayer color filter located on the imager die. A color filter is not shown in the optical path, however an infrared blocking filter can be inserted into the optical path if desired or to provide imaging capability in a specific color band (such as R, G or B). The lens frame 1401 in an embodiment extends between each optical channel. The electrical connections of imager module 1400 are as described above with reference to other embodiments. The optical frame 1401 attaching to the imager die can be modified in various embodiments to register on all four sides on the imager die to provide precise alignment of the optics to the imaging regions in both x and y axes. Imaging module 1400 provides a relatively small imager module footprint. The LGS focus mechanism as described above provides high MTF in each channel with a wider range of focus adjustment than the previous BFL focus method.

Figure 15:
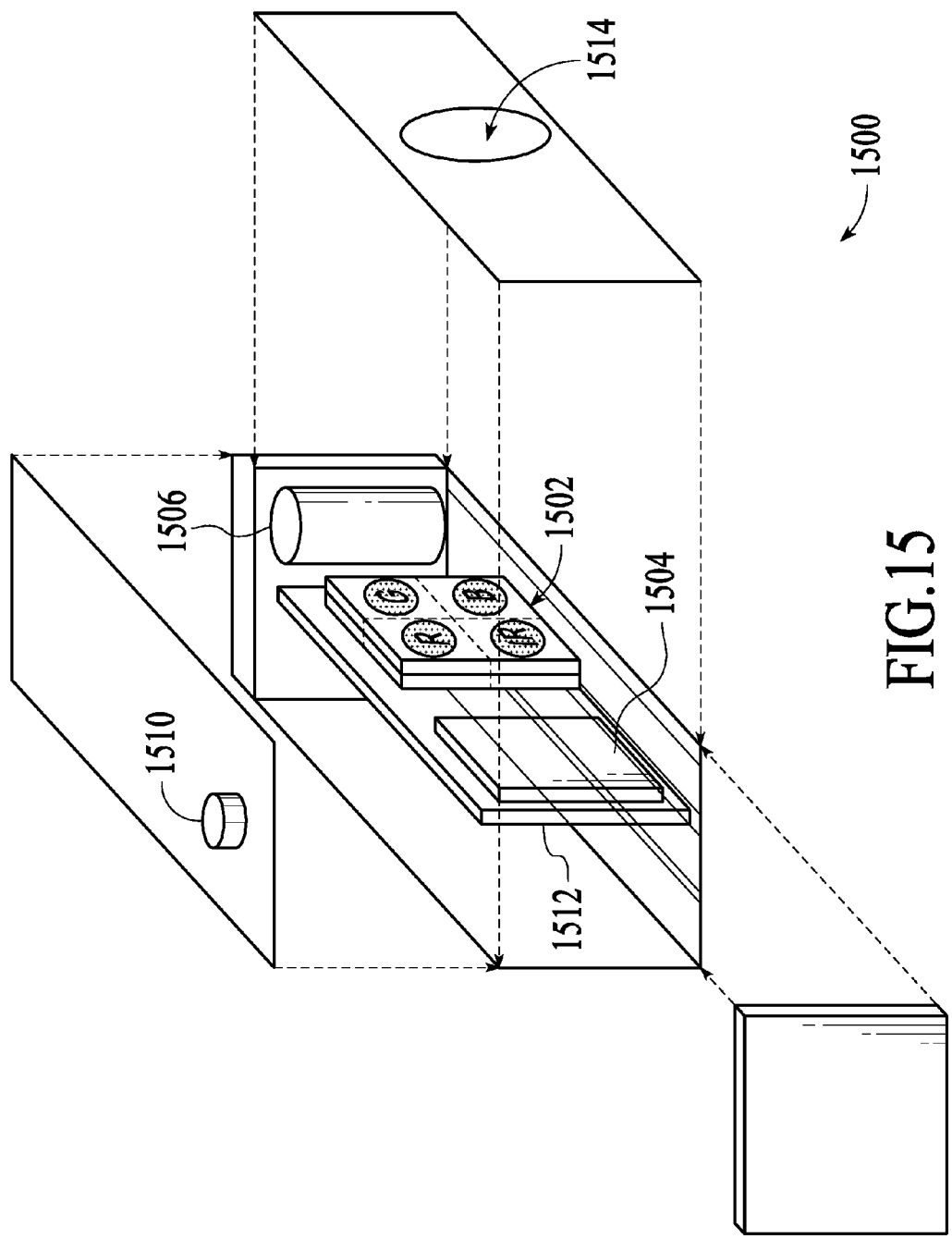
FIG. 15 is a block diagram of a digital camera, under an embodiment.

FIGS. 15-27 illustrate further examples of apparatus and systems in which the imaging module and focusing method embodiments disclosed above can be implemented. FIG. 15 is a block diagram of a digital camera 1500, under an embodiment. The digital camera includes a digital camera subsystem 1502, a circuit board 1512, a peripheral user interface electronics 1510 (here represented as a shutter button, but could also include display and/or one or more other output devices, setting controls and/or one or more additional input devices etc), a power supply 1506, and electronic image storage media 1504. The digital camera 1500 may further include a housing and a shutter assembly (not shown), which controls an aperture 1514 and passage of light into the digital camera 1500.

Figure 16:
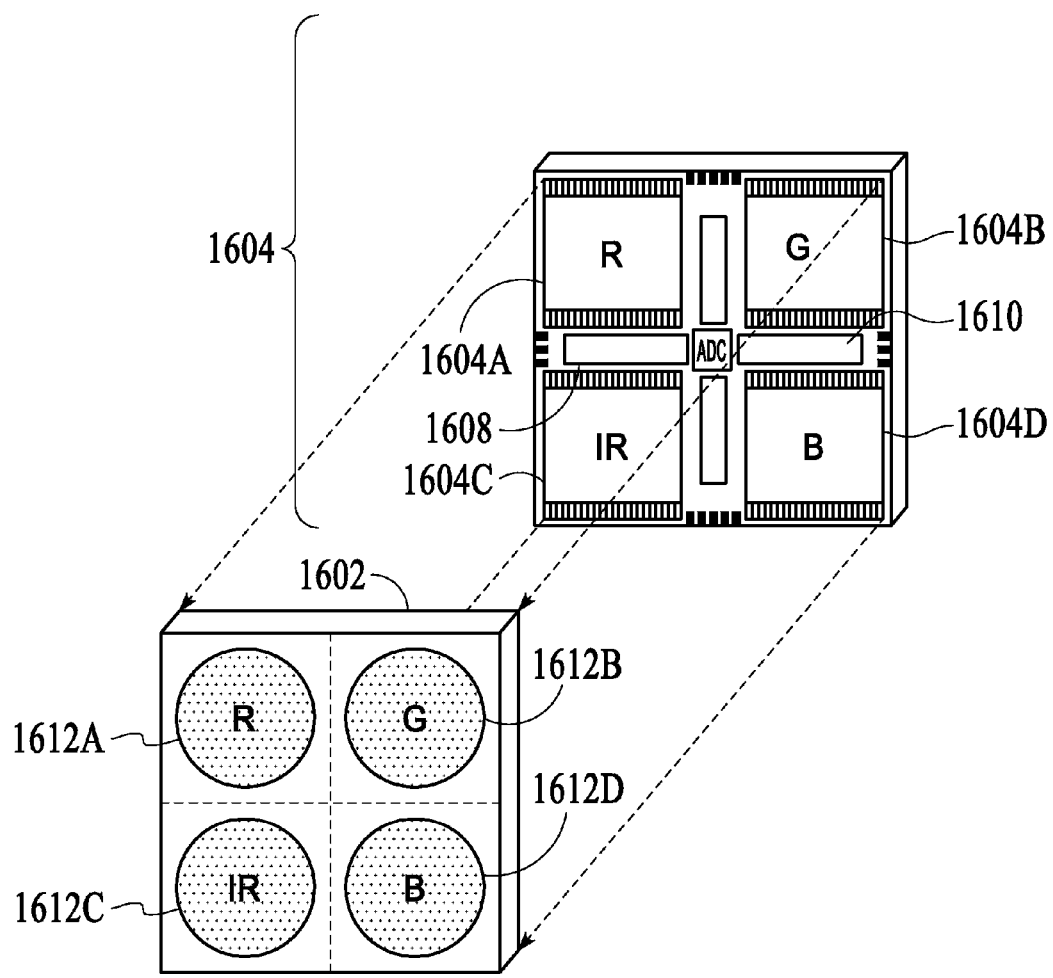
FIG. 16 is an exploded view of a digital camera subsystem, under an embodiment.

FIG. 16 is an exploded view of the digital camera subsystem 1502, under an embodiment. In this embodiment, the digital camera subsystem includes an image sensor 1604, an optics frame (also referred to as a frame) 1602, and lenses 1612A-1612D. The frame 1602 is used to mount the lenses 612A-1612D to the image sensor 1604. The image sensor, or imager die 1604 generally includes a semiconductor integrated circuit or "chip" having several higher order features including multiple arrays 1604A-1604D and signal processing circuits 1608 and 1610. Each of the arrays 1604A-1604D captures photons and outputs electronic signals. The signal processing circuit 1608, in certain embodiments, processes signals for each of the individual arrays 1604. The signal processing circuit 1610 may combine the output from signal processing 1608 into output data (usually in the form of a recombined full color image). Each array and the related signal processing circuitry may be tailored to address a specific band of visible spectrum.

Each of lenses 1612A-1612D may be tailored for the respective wavelength of the respective array. Lenses are approximately the same size as the underlying array 1604, and will differ from one another in size and shape depending upon the dimensions of the underlying array. In alternative embodiments a lens could cover only a portion of an array, and could extend beyond the array. Lenses can comprise any suitable material or materials, including for example, glass and plastic. Lenses can be doped in any suitable manner, such as to impart a color filtering, polarization, or other property. Lenses can be rigid or flexible.

In the example of FIG. 16, each lens, array, and signal processing circuit constitutes an image generating subsystem for a band of visible spectrum (e.g., red, blue, green, etc). These individual images are then combined with additional signal processing circuitry within the semiconductor chip to form a full image for output.

Figure 17:
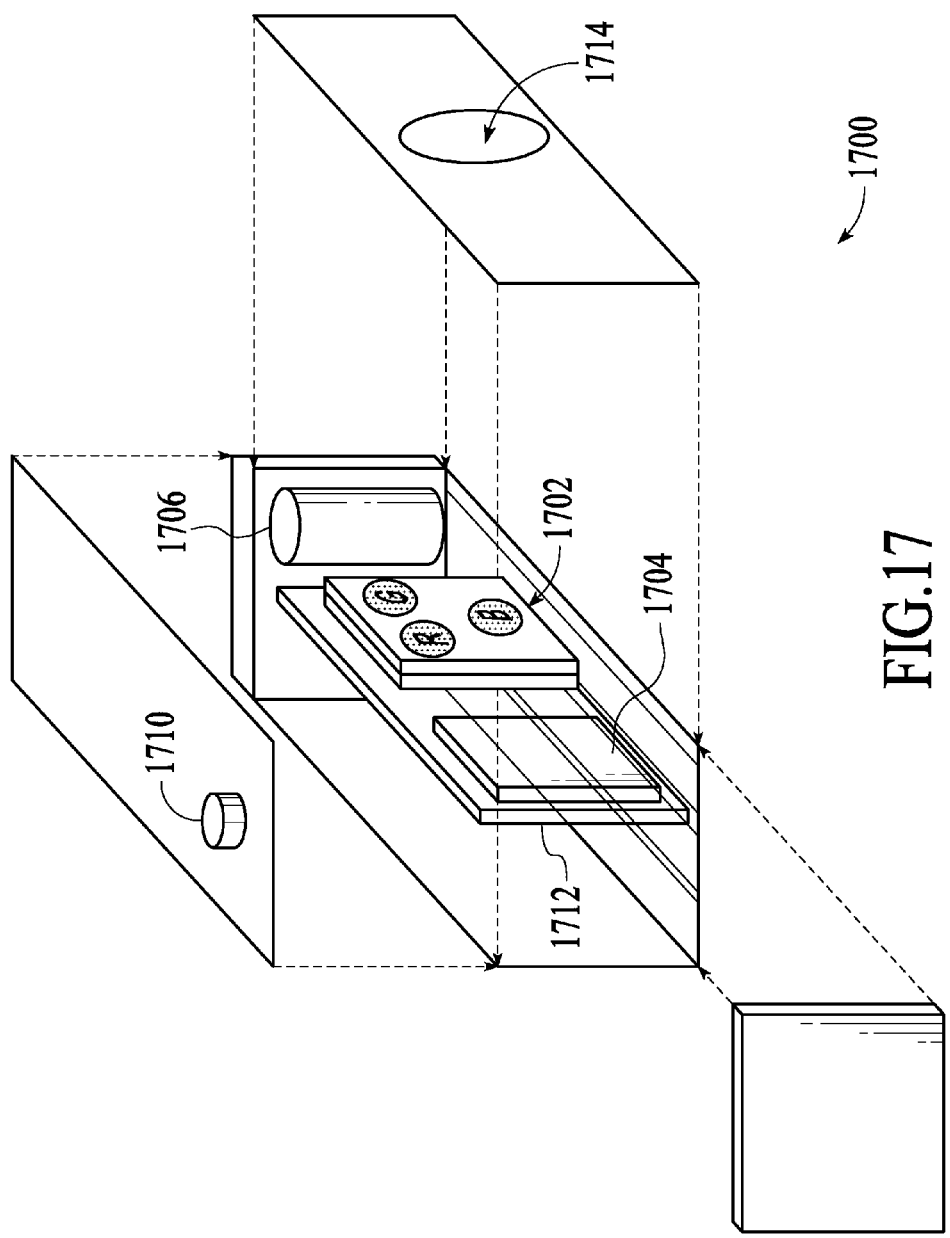
FIG. 17 is a block diagram of a digital camera having a three array/lens configuration, under an embodiment.

Although the digital camera subsystem 1604 is depicted in a four array/lens configuration, the digital camera subsystem can be employed in a configuration having any number of arrays/lenses and any combination of shapes of arrays/lenses. FIG. 17 is a block diagram of a digital camera 1700 having a three array/lens configuration, under an embodiment. The digital camera 1700 includes a digital camera subsystem 1702 that includes three lenses. The digital camera 1700 further includes a circuit board 1712, a peripheral user interface electronics 1710 (here represented as a shutter button, but could also include display and/or one or more other output devices, setting controls and/or one or more additional input devices etc), a power supply 1706, and electronic image storage media 1704. The digital camera 1700 may further include a housing and a shutter assembly (not shown), which controls an aperture 1714 and passage of light into the digital camera 1700.

Figure 18:
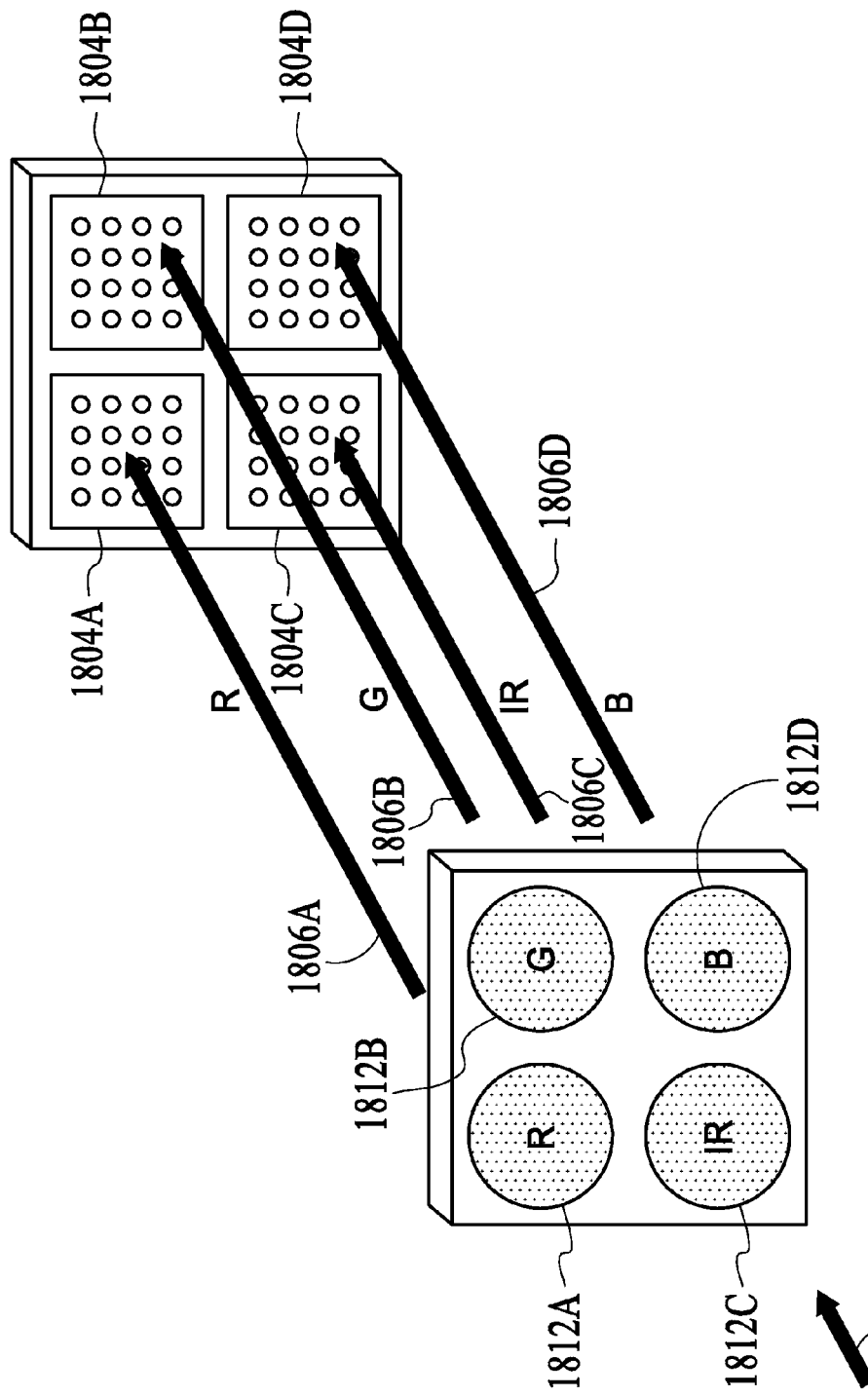
FIG. 18 is a block diagram of a digital camera subsystem that employs separate arrays on one image sensor, under an embodiment.

FIG. 18 is a block diagram of a digital camera subsystem that employs separate arrays, e.g., arrays 1804A-1804D, on one image sensor, in contrast to the prior art. For example, typical prior art approaches employ a Bayer pattern (or variations thereof), perform operations across the array (a pixel at a time), and integrate each set of four pixels (for example, red/green/blue/green or variation thereof) from the array into a single full color pixel.

Each of the arrays 1804 focuses on a specific band of visible spectrum. Each lens only needs to pass a respective color (1806A-1806D) on to the image sensor. The traditional color filter sheet is eliminated. Each array 1804 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

As such, each array may be tuned to be more efficient in capturing and processing the image in that particular color. Individual lenses (1812A-D) can be tailored for the array's band of spectrum.

Figure 19:
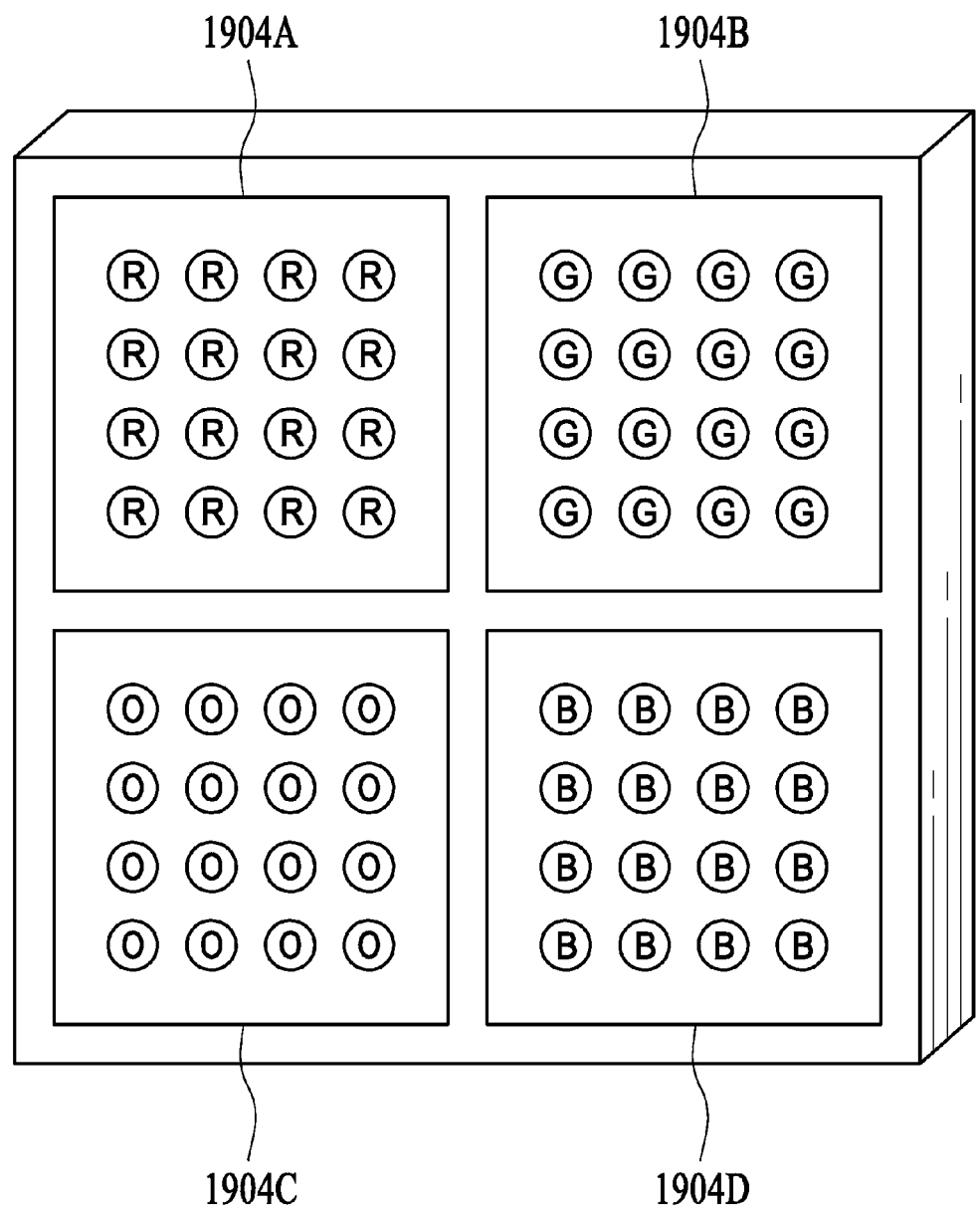
FIG. 19 is a block diagram of arrays, each of which receives a respective color as passed by a respective lens, under an embodiment.

FIG. 19 is a block diagram of arrays 1904A-1904D. Each array 1904 receives a respective color as passed by a respective lens. The traditional color filter sheet is eliminated. Each array 1904 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

Figure 20:
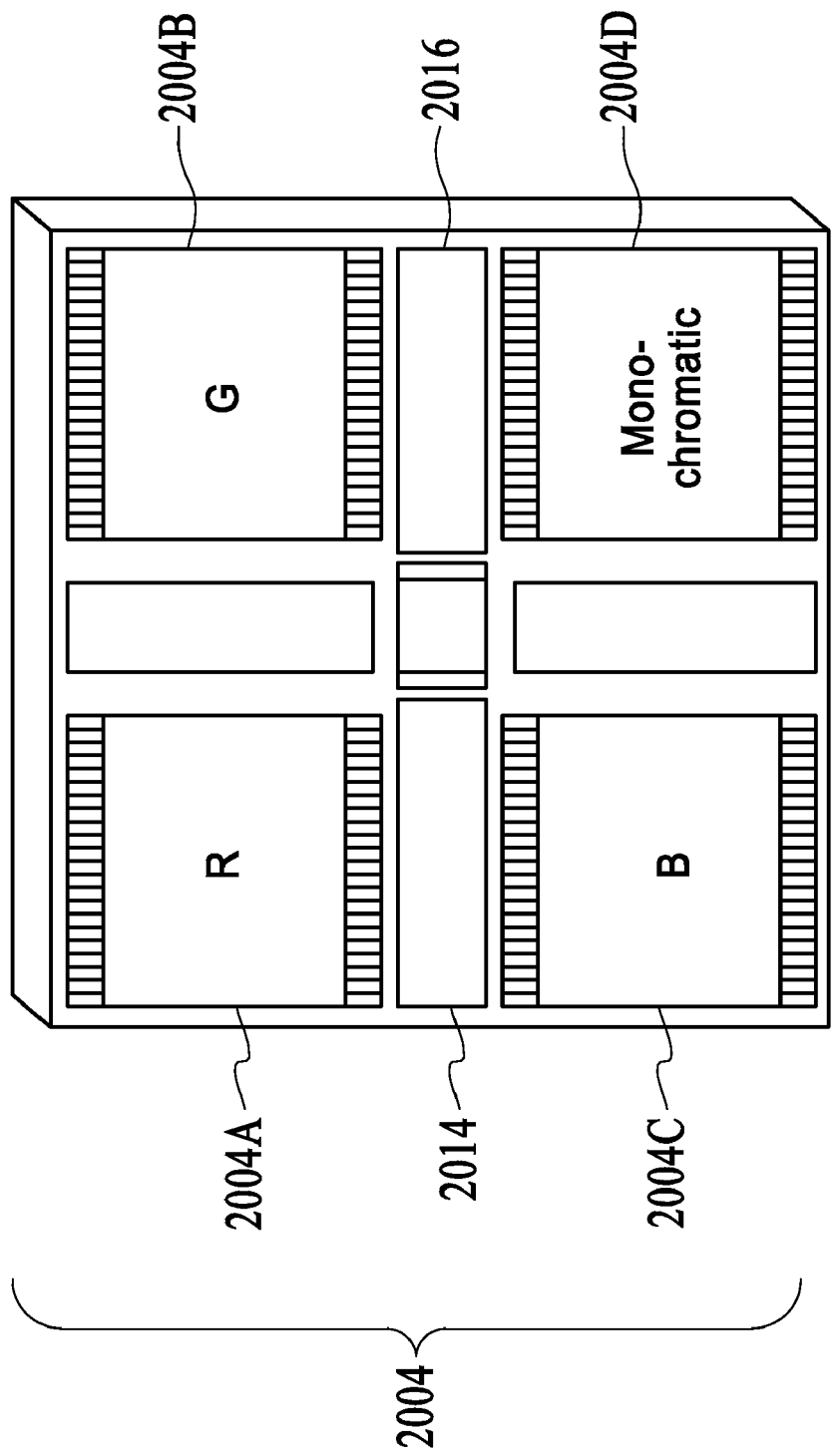
FIG. 20 is a block diagram of processing circuitry of a digital camera subsystem, under an embodiment.

FIG. 20 is a block diagram of processing circuitry of a digital camera subsystem, under an embodiment. FIG. 20 includes an array 2004, including arrays 2004A-2004D, and signal processing blocks 2014 and 2016. Each array outputs signals to signal image block 2014. Each signal processing block 2014 and 2016 represents a circuit or group of circuits, and may also be referred to as signal processing circuitry or image processing circuitry.

Figure 21:
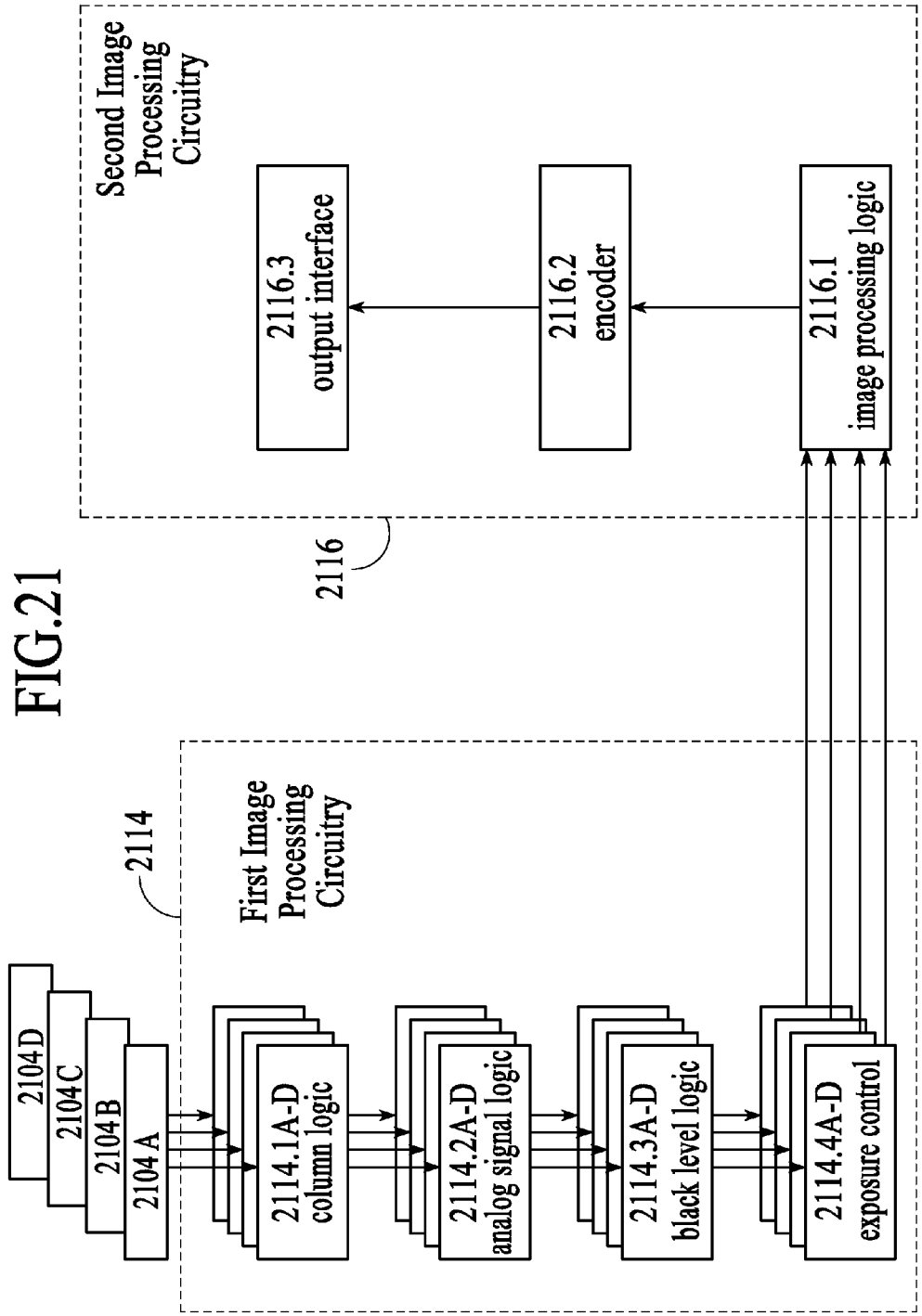
FIG. 21 is a block diagram of signal processing circuitry, under an embodiment.

FIG. 21 is a block diagram of image processing circuitry 2014 and 2016. Within the image processing circuitry 2014, each array can be processed separately to tailor the processing to the respective bands of spectrum.

Column logic 2114.1A-2114.1D is the portion of the signal processing circuitry that reads the signals from the pixels. For example, the column logic 2114.1A reads signals from the pixels in array 2104A. Column logic 2114.1B reads signals from the pixels in array 2104B. Column logic 2114.1C reads signals from the pixels in array 2104C. Column logic 2114.1D reads signals from the pixels in array 2104D.

Since an array is targeting a specific wavelength, wavelengths, band of wavelength, or band of wavelengths, the column logic may have different integration times for each array enhancing dynamic range and/or color specificity. Signal processing circuitry complexity for each array can be substantially reduced since logic may not have to switch between extreme color shifts.

Analog Signal Logic (ASL) 2114.2A-2114.2D for each array may be color specific. As such, the ASL processes a single color and therefore can be optimized for gain, noise, dynamic range, linearity, etc. Due to color signal separation, dramatic shifts in the logic and settling time are not required as the amplifiers and logic do not change on a pixel by pixel (color to color) basis as in traditional Bayer patterned designs.

Black level control 2114.3A-2114.3D assesses the level of noise within the signal, and filters it out. With each array focused upon a narrower band of visible spectrum than traditional image sensors, the black level control can be more finely tuned to eliminate noise.

Exposure control 2114.4A-2114.4D measures the overall volume of light being captured by the array and adjusts the capture time for image quality. Traditional cameras must make this determination on a global basis (for all colors). The embodiments describe herein allow for exposure control to occur differently for each array and targeted band of wavelengths.

These processed images are then passed to a second group of signal processing circuitry 2116. First, image processing logic 2116.1 integrates the multiple color planes into a single color image. The image is adjusted for saturation, sharpness, intensity, hue, artifact removal, and defective pixel correction.

In an embodiment, the final two operations include encoding the signal into standard protocols such as MPEG, JPEG, etc. in an encoder 2116.2 before passing the result to a standard output interface 2116.3, such as USB.

Although the signal processing circuitries 2114 and 2116 are shown at specific areas of the image sensor, the signal processing circuitries 2114 and 2116 can be placed anywhere on the chip and subdivided in any fashion. The signal processing circuitries are often placed in multiple locations.

As previously stated, the image sensor 2104 generally includes a semiconductor chip having several higher order features including multiple arrays (2104A-2104D), and signal processing circuitry 2114, in which each array and the related signal processing circuitry is preferably tailored to address a specific band of visible spectrum. As noted above, the image sensor array can be configured using any multiple numbers and shapes of arrays.

The image sensor 2104 can be constructed using any suitable technology, including silicon and germanium technologies. The pixels can be formed in any suitable manner, can be sized and dimensioned as desired, and can be distributed in any desired pattern. Pixels that are distributed without any regular pattern may also be used.

Any range of visible spectrum can be applied to each array depending on the specific interest of the customer. Further, an infrared array could also be employed as one of the array/lens combinations giving low light capabilities to the sensor.

As previously described, arrays 2104A-2104D may be of any size or shape. While some figures referenced herein show the arrays as individual, discrete sections of the image sensor, these arrays may also be touching. There may also be one large array configured such that the array is subdivided into sections, and each section is focused upon one band of spectrum, creating the same effect as separate arrays on the same chip.

Although the well depth of the photo detectors across each individual array 2104 may be the same, the well depth of any given array may be different from that of other arrays of the sensor subsystem. A photo detector includes an area or portion of the photo detector that captures, collects, is responsive to, detects and/or senses the intensity illumination of incident light. In some embodiments, the well depth is the distance from the surface of the photo detector to a doped region.

Selection of an appropriate well depth depends on many factors, including the targeted band of visible spectrum. Since each entire array is likely to be targeted at one band of visible spectrum (e.g., red) the well depth can be configured to capture that wavelength and ignore others (e.g., blue, green). Doping of the semiconductor material in the color specific arrays can further be used to enhance the selectivity of the photon absorption for color-specific wavelengths.

In various embodiments, a digital camera subsystem can have multiple separate arrays on a single image sensor, each with its own lens. The simple geometry of smaller, multiple arrays allows for a smaller lenses (e.g., smaller diameter, thickness and focal length), which allows for reduced stack height in the digital camera.

The lens and frame concept is applicable to traditional image sensors (without the traditional color filter sheet) to gain physical size, cost and performance advantages.

Each array can advantageously be focused on one band of visible and/or detectable spectrum. Among other things, each lens may be tuned for passage of one specific band of wavelength. Since each lens would therefore not need to pass the entire light spectrum, the number of elements may be reduced, for example, to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (such as the sheet of individual pixel filters) thereby reducing cost, improving signal strength and eliminating the pixel reduction barrier.

The above-described devices can include any suitable number of combinations, including as few as two arrays/lenses, and many more than two arrays/lenses. Examples include: two arrays/lenses configured as red/green and blue; two arrays/lenses configured as red and blue/green; two arrays/lenses configured as red, green, blue; four arrays/lenses configured as red, blue, green, emerald (for color enhancement); four arrays/lenses configured as red, blue, green, infrared (for low light conditions); and eight arrays/lenses configured as double the above configurations for additional pixel count and image quality.

The cameras or camera subsystems described herein are intended to be emblematic of a generic appliance containing the digital camera subsystem. Thus, the description herein should be interpreted as being emblematic of still and video cameras, cell phones, other personal communications devices, surveillance equipment, automotive applications, computers, manufacturing and inspection devices, toys, plus a wide range of other and continuously expanding applications. Of course these alternative interpretations may or may not include the specific components as depicted herein. For example, the circuit board may not be unique to the camera function but rather the digital camera subsystem may be an add-on to an existing circuit board, such as in a cell phone.

Any or all of the methods and/or apparatus disclosed herein may be employed in any type of apparatus or process including, but not limited to still and video cameras, cell phones, other personal communications devices, surveillance equipment, automotive applications, computers, manufacturing and inspection devices, toys, plus a wide range of other and continuously expanding applications.

Although each array and the related signal processing circuitry is can be tailored to address a specific band of visible spectrum, and each lens may be tuned for passage of that one specific band of wavelength, there is no requirement that each such array and the related signal processing circuitry be tailored to address a specific band of the visible spectrum. Nor is there any requirement that each lens be tuned for passage of a specific band of wavelength or that each of the arrays be located on the same semiconductor device. Indeed, the embodiments described and illustrated herein, including the specific components thereof, need not employ wavelength-specific features. For example, the arrays and/or signal processing circuitry need not be tailored to address a specific wavelength or band of wavelengths.

Figure 22:
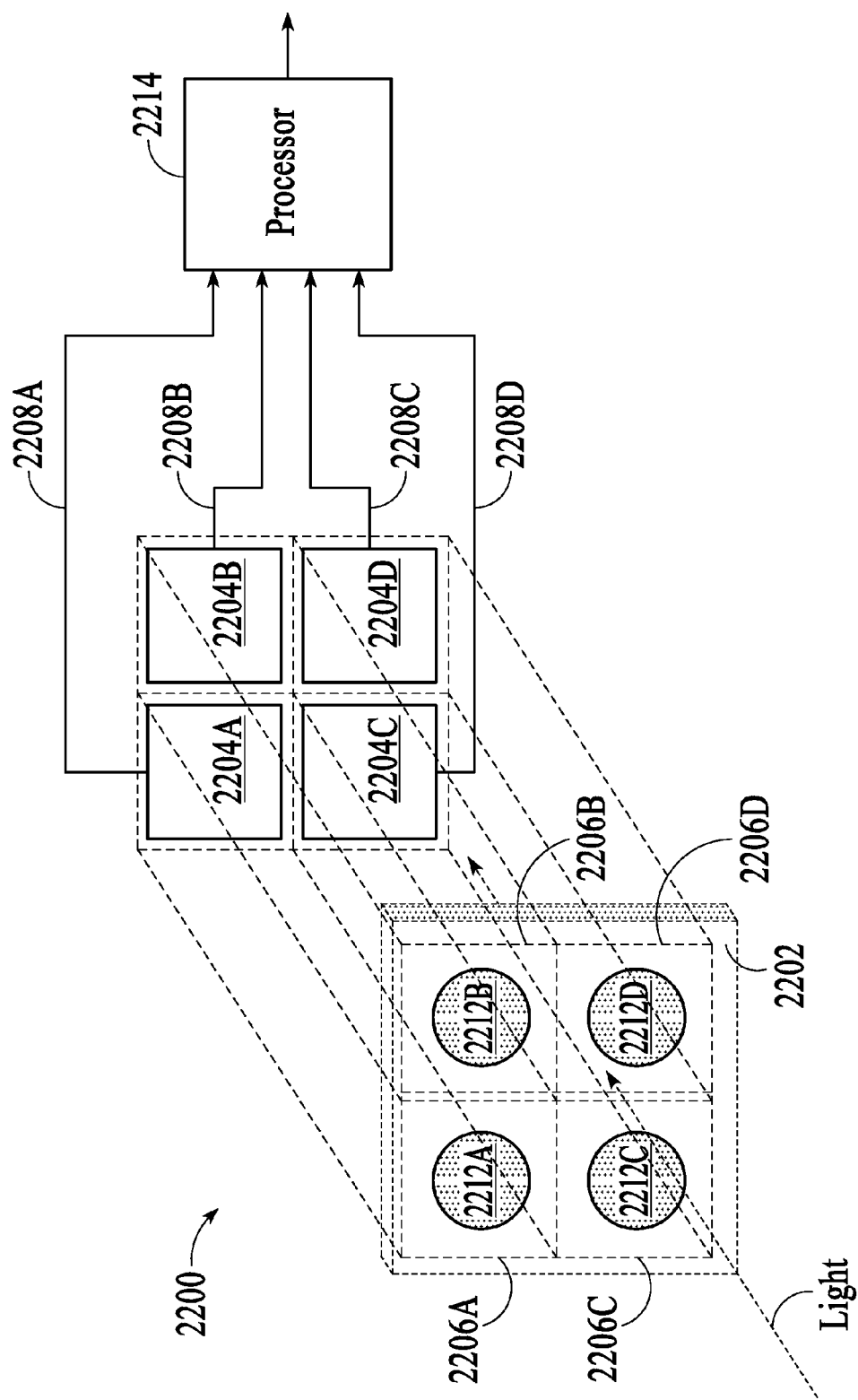
FIG. 22 is an exploded perspective view of a digital camera, under an embodiment.

FIG. 22 is an exploded perspective view of a digital camera 2200, under an embodiment. The digital camera apparatus 2200 includes one or more sensor arrays, e.g., four sensor arrays 2204A-2204D, and one or more optics portions, e.g., four optics portions 2212A-2212D. Each of the optics portions 2204A-2204D may include a lens, and may be associated with a respective one of the sensor arrays sensor arrays 2204A-2204D. In some embodiments a support 2202, for example a frame, is provided to support the one or more optics portions 2212A-2212D, at least in part. Each sensor array and the respective optics portion may define an optical channel. For example, an optical channel 2206A may be defined by the optics portion 2212A and the sensor array 2204A. An optical channel 2206B may be defined by the optics portion 2112B and the sensor array 2204B. An optical channel 2206C may be defined by optics portion 2212C and the sensor array 2204C. An optical channel 2206D may be defined by optics portion 2212D and a sensor array 2204D. The optics portions of the one or more optical channels are also collectively referred to as an optics subsystem.

The sensor arrays of the one or more optical channels are collectively referred as a sensor subsystem. The two or more sensor arrays may be integrated in or disposed on a common substrate, referred to as an image device, on separate substrates, or any combination thereof. For example, where the system includes three or more sensor arrays, two or more sensor arrays may be integrated in a first substrate, and one or more other sensor arrays may be integrated in or disposed on a second substrate.

In that regard, the one or more sensor arrays 2204A-2204D, may or may not be disposed on a common substrate. For example, in some embodiments two or more of the sensor arrays are disposed on a common substrate. In some embodiments, however, one or more of the sensor arrays is not disposed on the same substrate as one or more of the other sensor arrays. The one or more optical channels may or may not be identical to one another.

In some embodiments, one of the optical channels 2206 detects red light, one of the optical channels 2206 detects green light, and one of the optical channels 2206 detects blue light. In some of such embodiments, one of the optical channels 2206 detects infrared light, cyan light, or emerald light. In some other embodiments, one of the optical channels 2206 detects cyan light, one of the optical channels 2206 detects yellow light, one of the optical channels 2206 detects magenta light and one of the optical channels 2206 detects clear light (black and white). Any other wavelength or band of wavelengths (whether visible or invisible) combinations can also be used.

A processor 2214 is coupled to the one or more sensor arrays 2204A-2204D, via one or more communication links, e.g., communication links 2208A-2208D, respectively. A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may include for example circuit switching or packet switching or combinations thereof. Other examples of communication links include dedicated point-to-point systems, wired networks, and cellular telephone systems. A communication link may employ any protocol or combination of protocols including but not limited to the Internet Protocol.

The communication link may transmit any type of information. The information may have any form, including, for example, but not limited to, analog and/or digital) e.g., a sequence of binary values, or a bit string). The information may or may not be divided into blocks. If divided into blocks, the amount of information in a block may be predetermined or determined dynamically, and/or may be fixed (e.g., uniform) or variable.

As will be further described hereinafter, the processor may include one or more channel processors, each of which is coupled to a respective one (or more) of the optical channels and generates an image based at least in part on the signal(s) received from the respective optical channel, although this is not required. In some embodiments, one or more of the channel processors is tailored to its respective optical channel, for example, as described herein. For example, where one of the optical channels is dedicated to a specific wavelength or color (or band of wavelengths or colors), the respective channel processor may be adapted or tailored to such wavelength or color (or band of wavelengths or colors). Further, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective optical channel may facilitate generating an image of a quality that is higher than the quality of images resulting from traditional image sensors of like pixel count. In addition, providing each optical channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

In operation, an optics portion of a optical channel receives light from within a field of view and transmits one or more portions of such light, e.g., in the form of an image at an image plane. The sensor array receives one or more portions of the light transmitted by the optics portion and provides one or more output signals indicative thereof. The one or more output signals from the sensor array are supplied to the processor. In some embodiments, the processor generates one or more output signals based, at least in part, on the one or more signals from the sensor array. In some other embodiments, the processor may generate a combined image based, at least in part, on the images from two or more of such optical channels.

Although the processor 2214 is shown separate from the one or more sensor arrays 2204A-2204D, the processor 2214, or portions thereof, may have any configuration and may be disposed in one or more locations. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

The digital camera apparatus 2200 may or may not include a shutter, a flash and/or a frame to hold the components together.

Figure 23A:
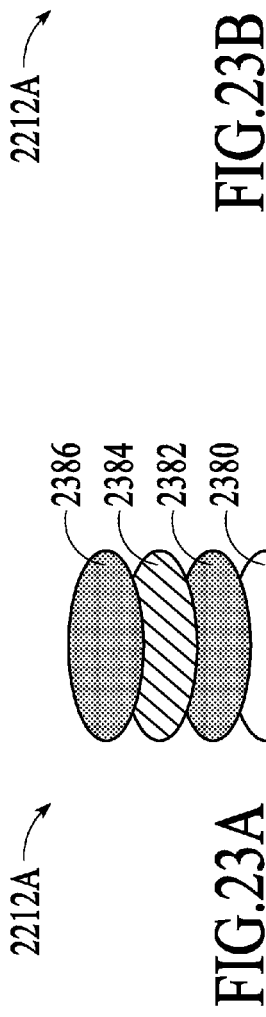
FIGS. 23A-23D are schematic exploded representations of one embodiment of an optics portion, under an embodiment.

FIGS. 23A-23D are schematic exploded representations of one embodiment of an optics portion, such as optic portion 2212A, under an embodiment. In FIG. 23A, the optics portion 2212A includes one or more lenses, e.g., a complex aspherical lens module 2380, one or more color coatings, e.g., a color coating 2382, one or more masks, e.g., an auto focus mask 2384, and one or more IR coatings, e.g., an IR coating 2386.

Lenses can comprise any suitable material or materials, including for example, glass and plastic. Lenses can be doped in any suitable manner, such as to impart a color filtering, polarization, or other property. Lenses can be rigid or flexible. In this regard, some embodiments employ a lens (or lenses) having a dye coating, a dye diffused in an optical medium (e.g., a lens or lenses), a substantially uniform color filter and/or any other filtering technique through which light passes to the underlying array.

The color coating 2382 helps the optics portion filter (or substantially attenuate) one or more wavelengths or bands of wavelengths. The auto focus mask 2384 may define one or more interference patterns that help the digital camera apparatus perform one or more auto focus functions. The IR coating 2386 helps the optics portion 2212A filter a wavelength or band of wavelength in the IR portion of the spectrum.

The one or more color coatings, e.g., color coating 2382, one or more masks, e.g., mask 2384, and one or more IR coatings, e.g., IR coating 2386 may have any size, shape and/or configuration.

Figure 23B:
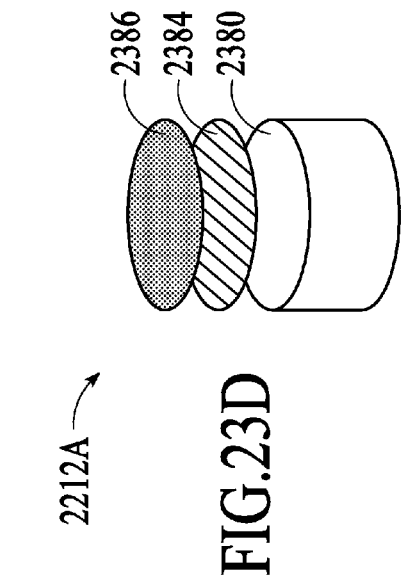

In some embodiments, as shown in FIG. 23B, one or more of the one or more color coatings, e.g., the color coating 2382, are disposed at the top of the optics portion. Some embodiments of the optics portion (and/or components thereof) may or may not include the one or more color coatings, one or more masks and one or more IR coatings and may or may not include features in addition thereto or in place thereof.

Figure 23C:
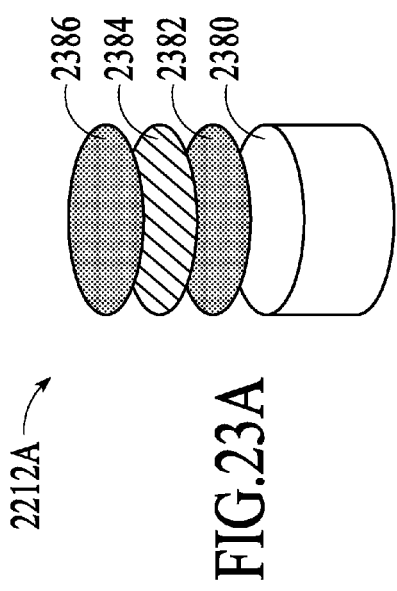
Figure 23D:
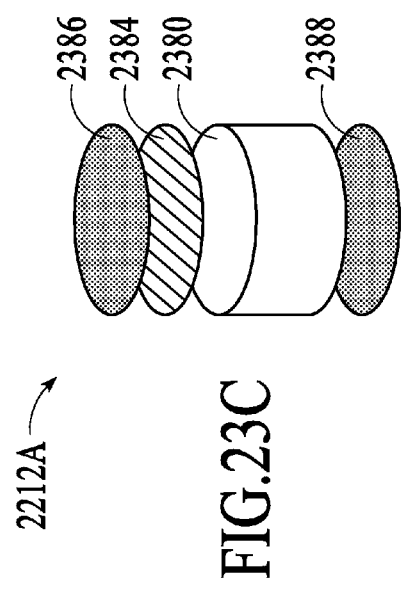

In some embodiments, as shown in FIG. 23C, one or more of the one or more color coatings, e.g., the color coating 2382, are replaced by one or more filters 2388 disposed in the optics portion, e.g., disposed below the lens. In other embodiments, as shown in FIG. 23D, one or more of the color coatings are replaced by one or more dyes diffused in the lens.

The one or more optics portions, e.g., optics portions 2212A-2212D of FIG. 22, may or may not be identical to one another. In some embodiments, for example, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, response, and/or performance) of one or more of the optics portions is tailored to the respective sensor array and/or to help achieve a desired result. For example, if a particular optical channel is dedicated to a particular color (or band of colors) or wavelength (or band of wavelengths) then the optics portion for that optical channel may be adapted to transmit only that particular color (or band of colors) or wavelength (or band of wavelengths) to the sensor array of the particular optical channel and/or to filter out one or more other colors or wavelengths. In some of such embodiments, the design of an optical portion is optimized for the respective wavelength or bands of wavelengths to which the respective optical channel is dedicated. It should be understood, however, that any other configurations may also be employed. Each of the one or more optics portions may have any configuration.

In some embodiments, each of the optics portions, e.g., optics portions 2212A-2212D of FIG. 22, comprises a single lens element or a stack of lens elements (or lenslets), although, as stated above. For example, in some embodiments, a single lens element, multiple lens elements and/or compound lenses, with or without one or more filters, prisms and/or masks are employed.

An optical portion can also contain other optical features that are desired for digital camera functionality and/or performance. For example, these features can include electronically tunable filters, polarizers, wavefront coding, spatial filters (masks), and other features not yet anticipated. Some of the features (in addition to the lenses) are electrically operated (such as a tunable filter), or are mechanically movable with MEMs mechanisms.

In some embodiments, one or more photochromic (or photochromatic) materials are employed in one or more of the optical portions. The one or more materials may be incorporated into an optical lens element or as another feature in the optical path, for example, above one or more of the sensor arrays. In some embodiments, photochromatic materials may be incorporated into a cover glass at the camera entrance (common aperture) to all optics (common to all optical channels), or put into the lenses of one or more optical channels, or into one or more of the other optical features included into the optical path of an optics portion over any sensor array.

FIGS. 24A-24C are schematic representations of one embodiment of a sensor array 2404. The sensor array is similar to one of the sensor arrays 2204A-2204D of FIG. 22, foe example. As shown in FIG. 24A, the sensor array 2404 is coupled to circuits 2470, 2472, and 2474. The sensor array sensor array 2404 captures light and converts it into one or more signals, such as electrical signals, which are supplied to one or more of the circuits 2470, 2472, and 2474. The sensor array 2404 includes a plurality of sensor elements such as for example, a plurality of identical photo detectors (sometimes referred to as "picture elements" or "pixels"), e.g., pixels $2480_{1,1}$-$2480_{n,m}$. The photo detectors $2480_{1,1}$-$2480_{n,m}$, are arranged in an array, for example a matrix-type array. The number of pixels in the array may be, for example, in a range from hundreds of thousands to millions. The pixels may be arranged for example, in a two-dimensional array configuration, for example, having a plurality of rows and a plurality of columns, e.g., 640×480, 1280×1024, etc. However, the pixels can be sized and dimensioned as desired, and can be distributed in any desired pattern. Pixels that are distributed without any regular pattern can also used. Referring to FIG. 24B, a pixel, for example pixel $2480_{1,1}$, may be viewed as having x and y dimensions, although the photon capturing portion of a pixel may or may not occupy the entire area of the pixel and may or may not have a regular shape. In some embodiments, the sensor elements are disposed in a plane, referred to herein as a sensor plane. The sensor may have orthogonal sensor reference axes, including for example, an x-axis, a y-axis, and a z-axis, and may be configured so as to have the sensor plane parallel to the x-y plane XY and directed toward the optics portion of the optical channel. Each optical channel has a field of view corresponding to an expanse viewable by the sensor array. Each of the sensor elements may be associated with a respective portion of the field of view.

The sensor array may employ any type of technology, for example, but not limited to MOS pixel technologies (e.g., one or more portions of the sensor are implemented in "Metal Oxide Semiconductor" technology), charge coupled device (CCD) pixel technologies, or combination of both. The sensor array may comprise any suitable material or materials, including, but not limited to, silicon, germanium and/or combinations thereof. The sensor elements or pixels may be formed in any suitable manner.

In operation, the sensor array 2404A, is exposed to light on a sequential line per line basis (similar to a scanner, for example) or globally (similar to conventional film camera exposure, for example). After being exposed to light for certain period of time (exposure time), the pixels $2480_{1,1}$-$2480_{n,m}$, are read out, e.g., on a sequential line per line basis.

In some embodiments, circuitry 2470, also referred to as column logic 2470, is used to read the signals from the pixels $2480_{1,1}$-$2480_{n,m}$. FIG. 24C is a schematic representation of a pixel circuit. The pixels $2480_{1,1}$-$2480_{n}$, also referred to as sensor elements, may be accessed one row at a time by asserting one of the word lines 2482, which run horizontally through the sensor array 2404A. A single pixel $2480_{1,1}$ is shown. Data is passed into and/or out of the pixel $2480_{1,1}$ via bit lines (such as bit line 2484) which run vertically through the sensor array 2404A.

The pixels are not limited to the configurations shown in FIGS. 24A-24C. As stated above, each of the one or more sensor arrays may have any configuration (e.g., size, shape, pixel design).

The sensor arrays 2202A-2202D of FIG. 22 may or may not be identical to one another. In some embodiments, for example, the sensor arrays are identical to one another. In some other embodiments, one or more of the sensor arrays are different, in one or more respects, from one or more of the other sensor arrays. For example, in some embodiments, one or more of the characteristics (for example, but not limited to, its type of element(s), size (for example, surface area), and/or performance) of one or more of the sensor arrays is tailored to the respective optics portion and/or to help achieve a desired result.

Figure 25:
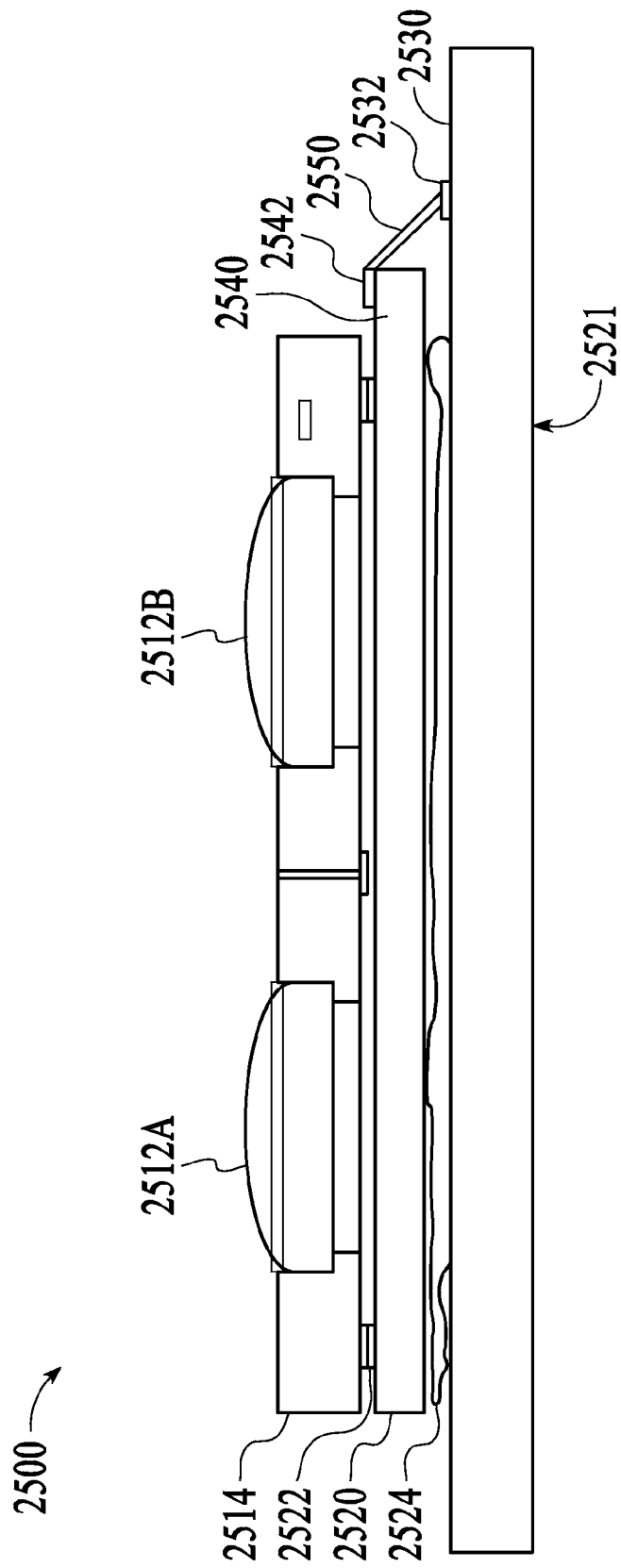
FIG. 25 is a schematic cross-sectional view of a digital camera apparatus, under an embodiment.

FIG. 25 is a schematic cross-sectional view of a digital camera apparatus 2500 including a printed circuit board 2520 of a digital camera on which the digital camera elements are mounted, under an embodiment. In this embodiment, the one or more optics portions, e.g., optics portions 2512A and 2512B are seated in and/or affixed to a support 2514. The support 2514 (for example a frame) is disposed superjacent a first bond layer 2522, which is disposed superjacent an image device 2520, in or on which sensor portions 2512A-2512D (sensor portions 2512C and 2512D are not shown), are disposed and/or integrated. The image device 2520 is disposed superjacent a second bond layer 2524 which is disposed superjacent the printed circuit board 2521.

The printed circuit board 2521 includes a major outer surface 2530 that defines a mounting region on which the image device 2520 is mounted. The major outer surface 2530 may further define and one or more additional mounting regions (not shown) on which one or more additional devices used in the digital camera may be mounted. One or more pads 2532 are provided on the major outer surface 2530 of the printed circuit board to connect to one or more of the devices mounted thereon.

The image device 2520 includes the one or more sensor arrays (not shown), and one or more electrically conductive layers. In some embodiments, the image device 2520 further includes one, some or all portions of a processor for the digital camera apparatus 2500. The image device 2520 further includes a major outer surface 740 that defines a mounting region on which the support 2514 is mounted.

The one or more electrically conductive layers may be patterned to define one or more pads 2542 and one or more traces (not shown) that connect the one or more pads to one or more of the one or more sensor arrays. The pads 2542 are disposed, for example, in the vicinity of the perimeter of the image device 2520, for example along one, two, three or four sides of the image device 2520. The one or more conductive layers may comprise, for example, copper, copper foil, and/or any other suitably conductive material(s).

A plurality of electrical conductors 2550 may connect one or more of the pads 2542 on the image device 2520 to one or more of the pads 2532 on the circuit board 2521. The conductors 2550 may be used, for example, to connect one or more circuits on the image device 2520 to one or more circuits on the printed circuit board 2521.

The first and second bond layers 2522 and 2524 may comprise any suitable material(s), including but not limited to adhesive, and may comprise any suitable configuration. The first and second bond layers 2522, 2524 may comprise the same material(s) although this is not required. As used herein, a bond layer may be continuous or discontinuous. For example, a conductive layer may be an etched printed circuit layer. Moreover, a bond layer may or may not be planar or even substantially planar. For example, a conformal bond layer on a non-planar surface will be non-planar.

Figure 26:
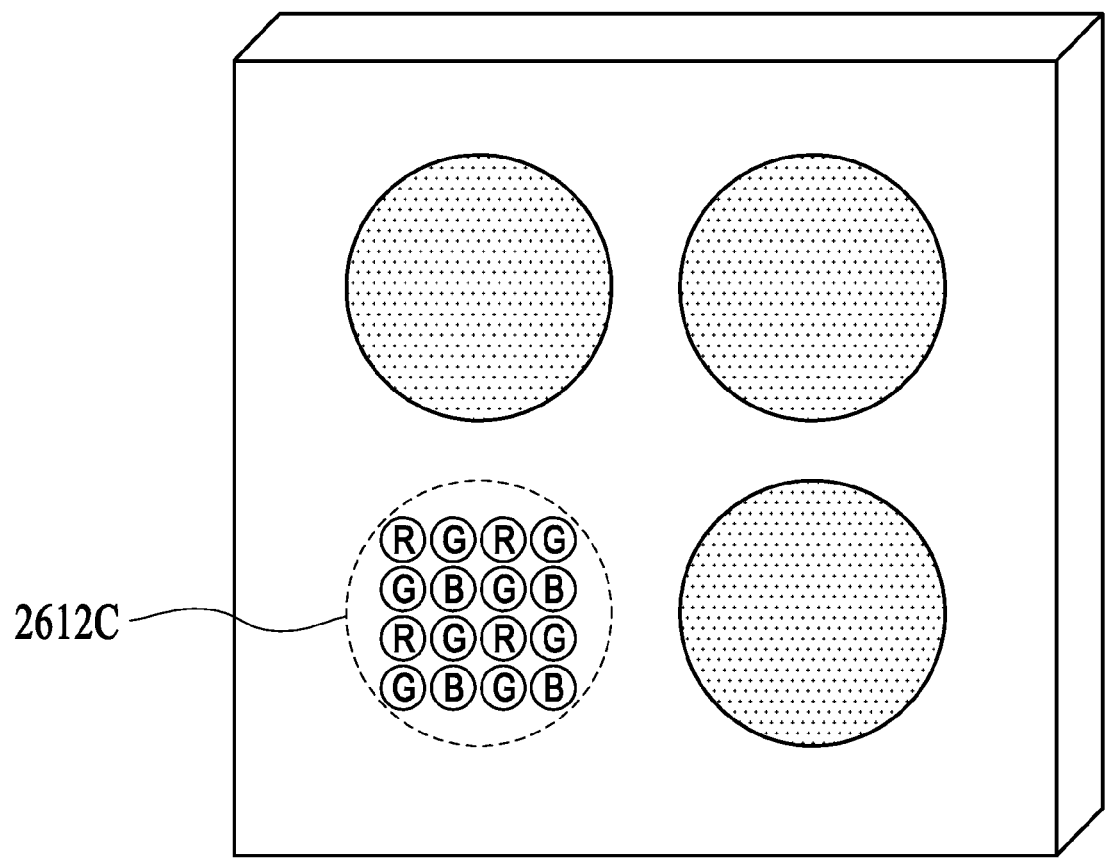
FIG. 26 is a schematic perspective view of a digital camera apparatus having one or more optics portions with the capability to provide color separation, under an embodiment.

FIG. 26 is a schematic perspective view of a digital camera apparatus having one or more optics portions with the capability to provide color separation in accordance with one embodiment of the present invention. In some of such embodiments, one or more of the optics portions, e.g., optics portion 2612C includes an array of color filters, for example, but not limited to a Bayer patter. In some of such embodiments, one or more of the optics portions, e.g., optics portion 2612C has the capability to provide color separation similar to that which is provided by a color filter array.

In some embodiments, the lens and/or filter of the optical channel may transmit both of such colors or bands of colors, and the optical channel may include one or more mechanisms elsewhere in the optical channel to separate the two colors or two bands of colors. For example, a color filter array may be disposed between the lens and the sensor array, and/or the optical channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures and/or characteristics that make them selective, such that the first photodiode has a higher sensitivity to the first color or first band of colors than to the second color or band of colors, and the second photodiode has a higher sensitivity to the second color or second band of colors than to the first color or first band of colors. Alternatively, the photodiodes are disposed at different depths in the pixel, taking advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed, even though the pixels may see only one particular color or band of colors, for example, to in order to adapt such sensor array to the particular color or band of colors.

Figure 27A:
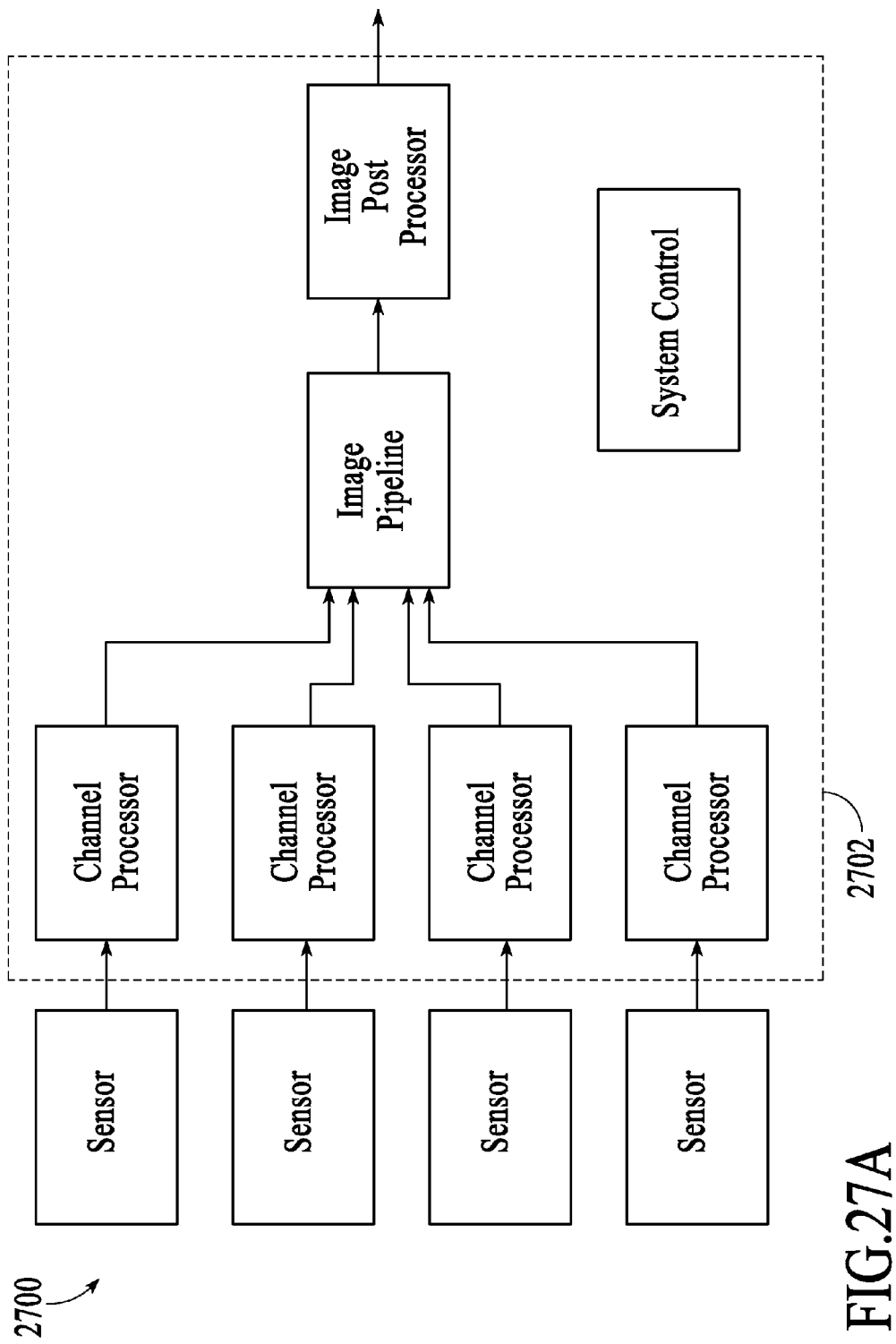
FIG. 27A is a block diagram of a processor of a digital camera subsystem, under an embodiment.

FIG. 27A is a block diagram of a processor 2702 of a digital camera subsystem 2700, under an embodiment. In this embodiment, the processor 2702 includes one or more channel processors, one or more image pipelines, and/or one or more image post processors. Each of the channel processors is coupled to a respective one of the optical channels (not shown) and generates an image based at least in part on the signal(s) received from the respective optical channel. In some embodiments the processor 2702 generates a combined imaged based at least in part on the images from two or more of the optical channels. In some embodiments, one or more of the channel processors are tailored to its respective optical channel, as previously described.

In various embodiments, the gain, noise reduction, dynamic range, linearity and/or any other characteristic of the processor, or combinations of such characteristics, may be adapted to improve and/or optimize the processor to a wavelength or color (or band of wavelengths or colors). Tailoring the channel processing to the respective optical channel makes it possible to generate an image of a quality that is higher than the quality of images resulting from traditional image sensors of like pixel count. In such embodiments, providing each optical channel with a dedicated channel processor helps to reduce or simplify the amount of logic in the channel processors, as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme The images (and/or data which is representative thereof) generated by the channel processors are supplied to the image pipeline, which may combine the images to form a full color or black/white image. The output of the image pipeline is supplied to the post processor, which generates output data in accordance with one or more output formats.

Figure 27B:
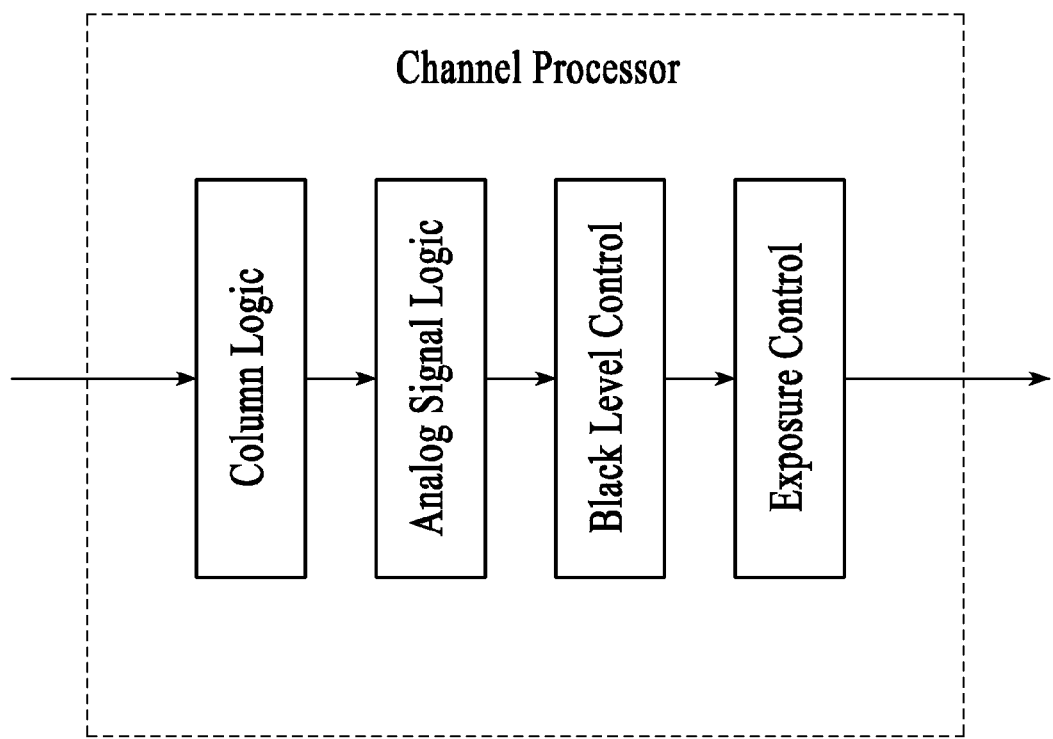
FIG. 27B is a block diagram of a channel processor of a digital camera subsystem, under an embodiment.

FIG. 27B shows one embodiment of a channel processor. In this embodiment, the channel processor includes column logic, analog signal logic, and black level control and exposure control. The column logic is coupled to the sensor and reads the signals from the pixels. Each of the column logic, analog signal logic, black level control and exposure control can be configured for processing as appropriate to the corresponding optical channel configuration (e.g., specific wavelength or color, etc.). For example, the column logic may employ an integration time or integration times adapted to provide a particular dynamic range as appropriate to the corresponding optical channel. Additionally, the analog signal logic is optimized, if desired, for processing. For example, gain, noise, dynamic range and/or linearity, etc., are optimized as appropriate to the corresponding optical channel configuration (e.g., a specific wavelength or color, etc.).

The output of the analog signal logic is supplied to the black level control, which determines the level of noise within the signal, and filters out some or all of such noise. If the sensor coupled to the channel processor is focused upon a narrower band of visible spectrum than traditional image sensors, the black level control can be more finely tuned to eliminate noise.

The output of the black level control is supplied to the exposure control, which measures the overall volume of light being captured by the array and adjusts the capture time for image quality. Traditional cameras must make this determination on a global basis (for all colors). In the camera of an embodiment, however, the exposure control can be specifically adapted to the wavelength (or band of wavelengths) to which the sensor is configured. Each channel processor is thus able to provide a capture time that is specifically adapted to the sensor and/or specific color (or band of colors) targeted, and which may be different than the capture time provided by another channel processor for another optical channel.

Figure 27C:
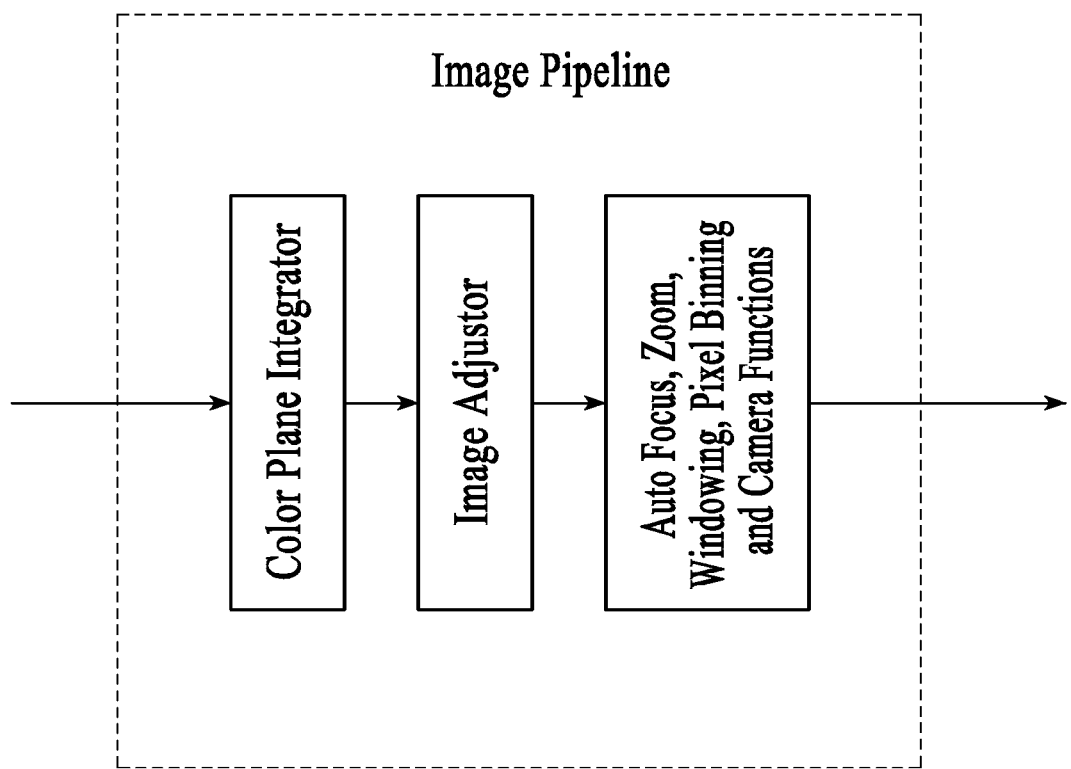
FIG. 27C is a block diagram of an image pipeline of a digital camera subsystem, under an embodiment.

FIG. 27C is a block diagram of the image pipeline, under an embodiment. In this embodiment, the image pipeline includes two portions. The first portion includes a color plane integrator and an image adjustor. The color plane integrator receives an output from each of the channel processors and integrates the multiple color planes into a single color image. The output of the color plane integrator, which is indicative of the single color image, is supplied to the image adjustor, which adjusts the single color image for saturation, sharpness, intensity and hue. The adjustor also adjusts the image to remove artifacts and any undesired effects related to bad pixels in the one or more color channels. The output of the image adjustor is supplied to the second portion of the pipeline, which provides auto focus, zoom, windowing, pixel binning and camera functions.

Figure 27D:
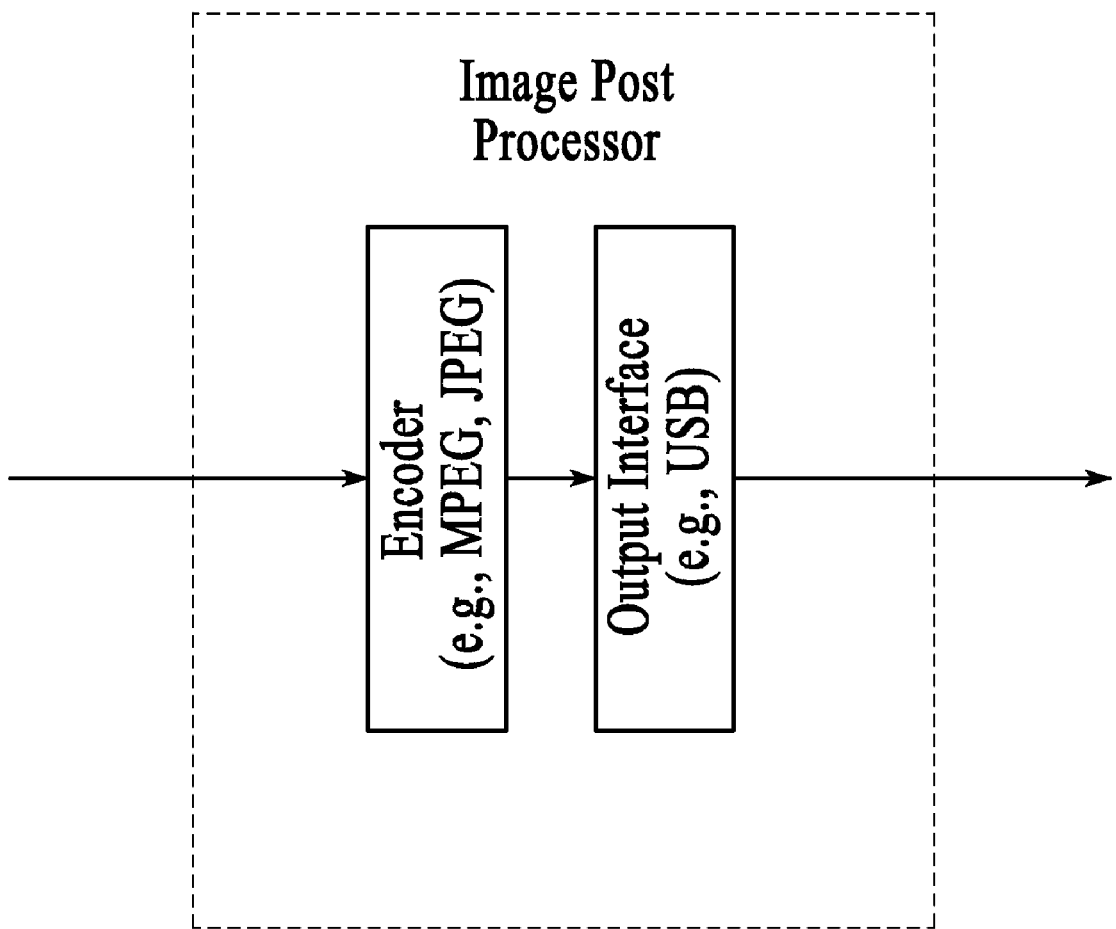
FIG. 27D is a block diagram of an image post processor of a digital camera subsystem, under an embodiment.

FIG. 27D is a block diagram of the image post processor, under an embodiment. In this embodiment, the image post processor includes an encoder and an output interface. The encoder receives the output signal from the image pipeline and provides encoding to supply an output signal in accordance with one or more standard protocols (e.g., MPEG and/or JPEG). The output of the encoder is supplied to the output interface, which provides encoding to supply an output signal in accordance with a standard output interface, e.g., universal serial bus (USB) interface.

Figure 28:
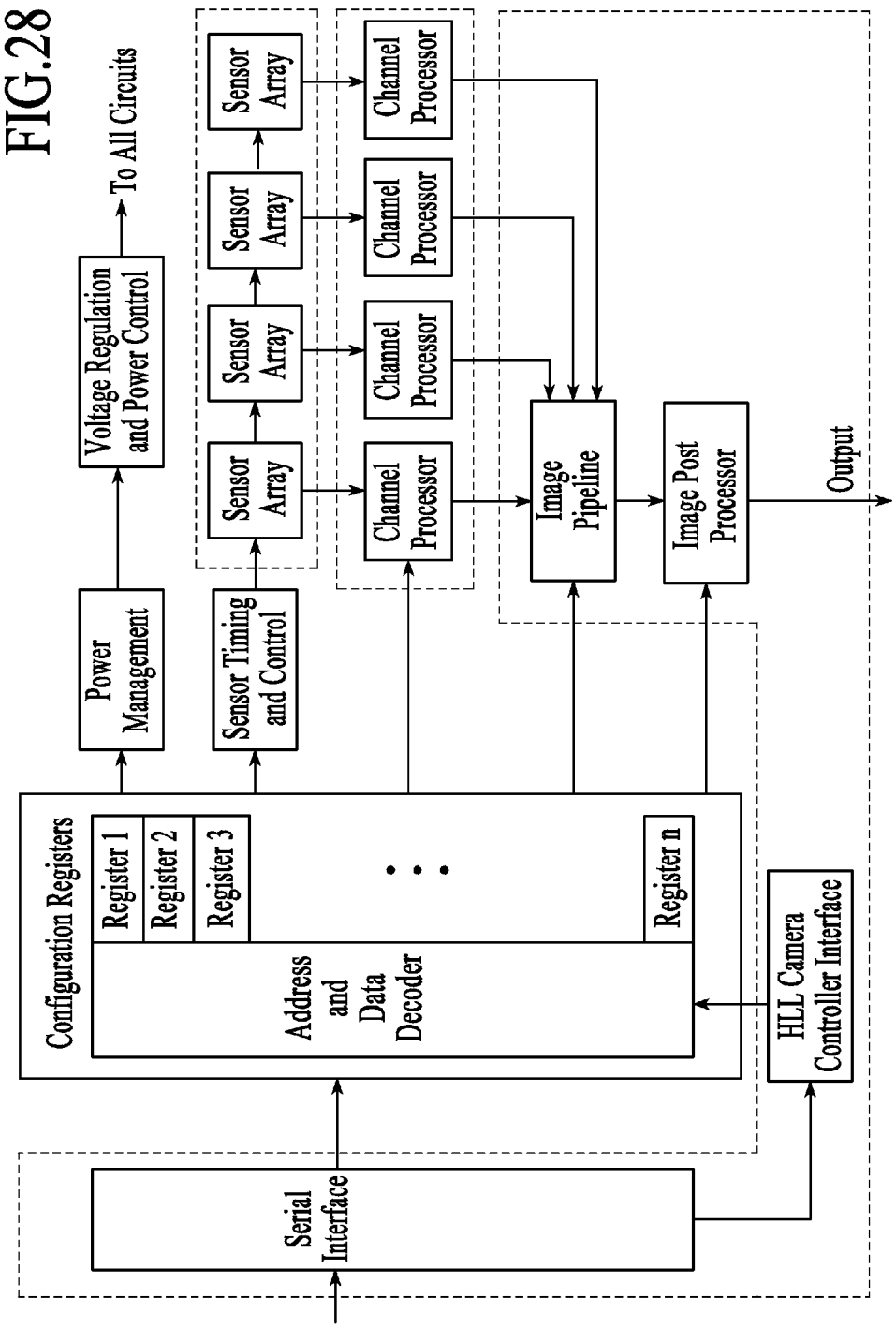
FIG. 28 is a block diagram of digital camera system, including system control components, under an embodiment.

FIG. 28 is a block diagram of digital camera system, including system control components, under an embodiment. The system control portion includes a serial interface, configuration registers, power management, voltage regulation and control, timing and control, a camera control interface and a serial interface, but is not so limited. In some embodiments, the camera interface comprises an interface that processes signals that are in the form of high level language (HLL) instructions. In some embodiments the camera interface comprises an interface that processes control signals that are in the form of low level language (LLL) instructions and/or of any other form now known or later developed. Some embodiments may process both HLL instructions and LLL instructions.

As used herein, the following terms are interpreted as described below, unless the context requires a different interpretation.

"Array" means a group of photodetectors, also know as pixels, which operate in concert to create one image. The array captures photons and converts the data to an electronic signal. The array outputs this raw data to signal processing circuitry that generates the image sensor image output.

"Digital Camera" means a single assembly that receives photons, converts them to electrical signals on a semiconductor device ("image sensor"), and processes those signals into an output that yields a photographic image. The digital camera would included any necessary lenses, image sensor, shutter, flash, signal processing circuitry, memory device, user interface features, power supply and any mechanical structure (e.g. circuit board, housing, etc) to house these components. A digital camera may be a stand-alone product or may be imbedded in other appliances, such as cell phones, computers or the myriad of other imaging platforms now available or to be created in the future, such as those that become feasible as a result of this invention.

"Digital Camera Subsystem" (DCS) means a single assembly that receives photons, converts them to electrical signals on a semiconductor device ("image sensor") and processes those signals into an output that yields a photographic image. The Digital Camera Subsystem includes any necessary lenses, image sensor, signal processing circuitry, shutter, flash and any frame to hold the components as may be required. The power supply, memory devices and any mechanical structure are not necessarily included.

"Electronic media" means that images are captured, processed and stored electronically as opposed to the use of film.

"Frame" or "thin plate" means the component of the DCS that is used to hold the lenses and mount to the image sensor or imager die.

"Image sensor" means the semiconductor device that includes the photon detectors ("pixels"), processing circuitry and output channels. The inputs are the photons and the output is the image data.

"Lens" means a single lens or series of stacked lenses (a column one above the other) that shape light rays above an individual array. When multiple stacks of lenses are employed over different arrays, they are called "lenses."

"Package" means a case or frame that an image sensor (or any semiconductor chip) is mounted in or on, which protects the imager and provides a hermetic seal. "Packageless" refers to those semiconductor chips that can be mounted directly to a circuit board without need of a package.

The terms "Photo-detector" and "pixels" mean an electronic device that senses and captures photons and converts them to electronic signals. These extremely small devices are used in large quantities (hundreds of thousands to millions) in a matrix to capture an image.

"Semiconductor Chip" means a discrete electronic device fabricated on a silicon or similar substrate, which is commonly used in virtually all electronic equipment.

"Signal Processing Circuitry" means the hardware and software within the image sensor that translates the photon input information into electronic signals and ultimately into an image output signal.

What is claimed is:

1. A lens frame apparatus, comprising:
 a lower frame portion mounted on an imager die, wherein the imager die includes at least one image capture microelectronic device, and further wherein the lower frame portion includes a plurality of void areas; and
 an upper frame structure detachably coupled to the lower frame portion, and comprising a plurality of cutouts corresponding to the plurality of void areas, wherein each cutout of the plurality of cutouts has an inner surface for supporting a mounted lens barrel.

2. The lens frame apparatus of claim 1, wherein the plurality of cutouts comprises three circular cutouts, each disposed at an apex of a triangle, and further wherein the plurality of void areas comprises three corresponding void areas.

3. The lens frame apparatus of claim 1, wherein each respective mounted lens barrel is adjustably mounted and comprises one or more optical lenses mounted within the respective adjustably mounted lens barrel perpendicular to a plane defined by an imaging axis through the respective adjustably mounted lens barrel.

4. The lens frame apparatus of claim 1, wherein each mounted lens barrel is adjustably mounted during a manufacturing process.

5. The lens frame apparatus of claim 3, wherein the one or more optical lenses of each adjustably mounted lens barrel is positioned to receive light from an object and to form an image of the object on one or more image regions located on the imager die.

6. The lens frame apparatus of claim 1, wherein each mounted lens barrel is configured to image light of a different wavelength.

7. The lens frame apparatus of claim 1, wherein each mounted lens barrel has a bottom surface with a chamfered annular portion, and further wherein each void area of the plurality of void areas has a chamfered upper annular surface that is configured to match a respective chamfered annular portion of the bottom surface of each mounted lens barrel, and further wherein the chamfered upper annular surface of each void area functions as a travel stop when a respective mounted lens barrel is adjustably mounted in a lowest position within the upper frame portion.

8. The lens frame apparatus of claim 1, wherein each mounted lens barrel includes at least:
 a first lens group located on an object side of the lens frame apparatus, wherein the first lens group includes at least a first optical lens; and
 a second lens group located between the first lens group and an image side of the lens frame apparatus, wherein the second lens group comprises at least a second optical lens, and further wherein the second lens group is separated from the first lens group by an adjustable gap.

9. The lens frame apparatus of claim 1, wherein the image capture microelectronic device comprises at least one of a Charged Coupled Device (CCD) image capture device or a Complementary Metal-Oxide Semiconductor (CMOS) image capture device.

10. The lens frame apparatus of claim 1, wherein the imager die is a CMOS integrated circuit.

11. An optical lens frame, comprising:
 an upper surface comprising a plurality of lens barrel holes;
 a perimeter structure extending downward from the upper surface along a periphery of the upper surface, wherein the perimeter structure is configured to rest relative to a top surface of an imager die; and
 a central support structure extending downward from a central portion of the upper surface toward the top surface of the imager die.

12. The optical lens frame of claim 11, wherein each lens barrel hole of the plurality of lens barrel holes is configured to accommodate a respective lens barrel comprising one or more optical lenses, and further wherein the one or more optical lenses is mounted within the respective lens barrel perpendicular to a plane defined by an imaging axis through the lens barrel.

13. The optical lens frame of claim 12, wherein each lens barrel is adjustably mounted within a respective circular cutout of the upper surface during a manufacturing process.

14. The optical lens frame of claim 12, wherein each lens barrel has a threaded shaft portion that is configured to mate with a threaded inner surface of a corresponding mounting hole through a respective lens barrel hole of the upper surface.

15. The optical lens frame of claim 12, wherein each lens barrel has a smooth shaft portion that is configured to friction fit to an inner surface of a corresponding mounting hole through a respective lens barrel hole of the upper surface.

16. The lens frame apparatus of claim 12, wherein the one or more optical lenses of each lens barrel is positioned to receive light from an object and to form an image of the object on one or more image regions of the imager die.

17. The lens frame apparatus of claim 16, wherein each lens barrel is configured to image light of a different wavelength.

18. The lens frame apparatus of claim 11, wherein the central support structure comprises a post.

19. The lens frame apparatus of claim 18, wherein the post has a cross-sectional shape of a circle, a rectangle, or a triangle.

20. The lens frame apparatus of claim 18, wherein the post includes one or more extensions configured to at least partially block light leakage between adjacent imaging areas defined by one or more optical lenses of a lens barrel.

21. A lens barrel comprising:
 a shaft portion configured to be mounted within a lens hole of a first frame portion;
 a barrel coupled to the shaft portion, wherein the barrel is configured to hold one or more lenses at least generally perpendicular to a longitudinal axis of the barrel; and
 a first mating region at a bottom surface of the barrel, wherein the first mating region is configured to stop against a corresponding second mating region on a second frame portion when the shaft portion is adjusted at a lowest position within the first frame portion, and further wherein the second frame portion is positioned between the first frame portion and an imaging die.

22. The lens barrel of claim 21, wherein the shaft portion is threaded to match corresponding threading in the lens hole, and further wherein the barrel is rotatably adjustable in the first frame portion.

23. The lens barrel of claim 21, wherein the shaft portion is smooth and configured to friction fit within the lens hole, and further wherein the barrel is slidably adjustable in the first frame portion.

24. The lens barrel of claim 23, further comprising a slot and peg assembly configured to hold the barrel in a fixed rotational position within the lens hole.

25. A method comprising:
 mounting a lower frame portion of a lens frame relative to an imager die for a digital camera, wherein the lower frame portion includes a plurality of void areas; and
 detachably mounting an upper frame structure to the lower frame portion, wherein the upper frame structure includes a plurality of cutouts corresponding to the plurality of void areas, wherein each cutout of the plurality of cutouts has an inner surface for supporting a mounted lens barrel of the digital camera.

26. The method of claim 25, further comprising mounting a plurality of lens barrels to the imager die.

27. The method of claim 26, wherein each of the plurality of lens barrels is in electrical communication with a bond pad, and wherein each bond pad is in electrical communication with the imager die.

28. The method of claim 26, wherein each of the plurality of lens barrels is positioned over a distinct imaging region of the imager die.

29. The method of claim 25, further comprising threading a plurality of lens barrels into at least the plurality of cutouts of the upper frame structure.

30. The method of claim 29, wherein the plurality of lens barrels threaded into the plurality of cutouts are rotatably adjustable relative to a focal plane of the imager die.

31. The method of claim 25, wherein the lower frame portion is configured to prevent cross talk between a plurality of lens barrels mounted to at least the upper frame portion.

32. The method of claim 25, further comprising placing the imager die in electrical communication with image processing circuitry, wherein the image processing circuitry is configured to generate an image by combining data received through each of a plurality of lens barrels.

33. A digital camera comprising:
   an imager die;
   a plurality of lens barrels; and
   a frame, wherein the frame comprises:
      a lower frame portion mounted relative to the imager die, wherein the lower frame portion includes a plurality of void areas; and
      an upper frame portion detachably coupled to the lower frame portion, and comprising a plurality of cutouts corresponding to the plurality of void areas, wherein each cutout of the plurality of cutouts has an inner surface for supporting one of the plurality of lens barrels.

34. The digital camera of claim 33, further comprising a processor operatively coupled to the imager die, wherein the processor is configured to generate an image based on a combination of information received through the plurality of lens barrels.

35. The digital camera of claim 33, wherein each of the plurality of lens barrels comprises one or more optical lenses, and wherein each of the one or more optical lenses is positioned to receive light from an object and to provide the light to an image region of the imager die.

36. The digital camera of claim 33, wherein each of the plurality of lens barrels is configured to image light of a different wavelength.

37. The digital camera of claim 33, wherein each lens barrel has a bottom surface with a mating annular portion, and wherein each void area of the plurality of void areas has a mating upper annular surface that is configured to match a respective mating annular portion of the bottom surface of the lens barrel.

38. The digital camera of claim 33, wherein each of the plurality of lens barrels is associated with a distinct portion of the imager die.

39. A digital camera comprising:
   a plurality of means for providing light to an imager die, wherein the light is reflected from an object;
   first means for supporting the plurality of means for providing the light to the imager die, wherein the first means for supporting is mounted relative to the imager die and comprises a plurality of void areas; and
   second means for supporting the plurality of means for providing the light to the imager die, wherein the second means for supporting comprises a plurality of cutouts corresponding to the plurality of void areas, and wherein each cutout of the plurality of cutouts has an inner surface for supporting one of the plurality of means for providing the light to the imager die.

40. The digital camera of claim 39, further comprising means for processing the light reflected from the object to generate an image of the object.

41. The digital camera of claim 39, wherein each of the plurality of means for providing the light is configured to provide a different wavelength of the light.

42. The digital camera of claim 39, wherein the plurality of means for providing the light are threaded into the plurality of cutouts.

* * * * *